US011983350B2

(12) United States Patent
Kang et al.

(10) Patent No.: US 11,983,350 B2
(45) Date of Patent: May 14, 2024

(54) DISPLAY DEVICE

(71) Applicant: Samsung Display Co., LTD., Yongin-si (KR)

(72) Inventors: Jong Hyuk Kang, Suwon-si (KR); Hyun Min Cho, Seoul (KR); Dae Hyun Kim, Hwaseong-si (KR); Hyun Deok Im, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 705 days.

(21) Appl. No.: 17/255,987

(22) PCT Filed: Sep. 21, 2018

(86) PCT No.: PCT/KR2018/011307
§ 371 (c)(1),
(2) Date: Dec. 23, 2020

(87) PCT Pub. No.: WO2020/027369
PCT Pub. Date: Feb. 6, 2020

(65) Prior Publication Data
US 2021/0273142 A1 Sep. 2, 2021
US 2021/0399181 A9 Dec. 23, 2021

(30) Foreign Application Priority Data
Jun. 26, 2018 (KR) .......................... 10-2018-0073582

(51) Int. Cl.
*H01L 25/075* (2006.01)
*G06F 3/01* (2006.01)
(Continued)

(52) U.S. Cl.
CPC ............ *G06F 3/0414* (2013.01); *G06F 3/016* (2013.01); *G06F 3/0412* (2013.01);
(Continued)

(58) Field of Classification Search
None
See application file for complete search history.

(56) References Cited

U.S. PATENT DOCUMENTS 8,899,767 B2   12/2014   Harbers et al.
9,059,114 B2    6/2015   Do et al.
(Continued)

FOREIGN PATENT DOCUMENTS

EP   3 282 310 A1   2/2018
EP   3 309 604 A2   4/2018
(Continued)

OTHER PUBLICATIONS

International Search Report of PCT/KR2018/011307, dated Apr. 25, 2019, 2 pages.

*Primary Examiner* — Jay C Chang
(74) *Attorney, Agent, or Firm* — Lewis Roca Rothgerber Christie LLP

(57) ABSTRACT

A display device comprises first and second pixels, a light-emitting layer, color conversion layers, and color filter layers, the light-emitting layer comprising first and second light-emitting elements in the first and second pixels, wherein the color conversion layers comprise first and second color conversion layers in the first and second pixels, the color filter layers comprise first and second color filter layers in the first and second pixels, the first and second light-emitting elements emit first light having a central wavelength range of a first wavelength, the first and second color conversion layers contain color conversion particles converting the first light into second light having a central wavelength range of a second wavelength longer than the first wavelength, the first color filter layer transmits the first light and blocks the second light, and the second color filter layer transmits the second light and blocks transmission of the first light.

19 Claims, 24 Drawing Sheets

(51) Int. Cl.
*G06F 3/041* (2006.01)
*G06F 3/04883* (2022.01)
*H01L 27/12* (2006.01)
*H01L 33/50* (2010.01)
*H01L 33/58* (2010.01)
*H01L 33/62* (2010.01)
*B82Y 20/00* (2011.01)

(52) U.S. Cl.
CPC ...... *G06F 3/04883* (2013.01); *H01L 25/0753* (2013.01); *H01L 27/1214* (2013.01); *H01L 33/502* (2013.01); *H01L 33/505* (2013.01); *H01L 33/58* (2013.01); *H01L 33/62* (2013.01); *B82Y 20/00* (2013.01); *G06F 2203/014* (2013.01); *H01L 2933/0066* (2013.01)

(56) References Cited

U.S. PATENT DOCUMENTS

| | | | |
|---|---|---|---|
| 10,184,618 | B2 | 1/2019 | Yoon et al. |
| 10,361,248 | B2 | 7/2019 | Lee et al. |
| 10,948,137 | B2 | 3/2021 | Yoon et al. |
| 2012/0250304 | A1 | 10/2012 | Harbers et al. |
| 2012/0250320 | A1 | 10/2012 | Harbers et al. |
| 2012/0319564 | A1 | 12/2012 | Ghosh et al. |
| 2015/0131280 | A1 | 5/2015 | Harbers et al. |
| 2015/0362165 | A1* | 12/2015 | Chu ........................ H01L 33/32 362/235 |
| 2017/0133357 | A1 | 5/2017 | Kuo et al. |
| 2017/0236866 | A1 | 8/2017 | Lee et al. |
| 2017/0358624 | A1* | 12/2017 | Takeya .................... H01L 33/42 |
| 2018/0045866 | A1 | 2/2018 | Chae et al. |
| 2018/0107028 | A1 | 4/2018 | Jung et al. |
| 2018/0113341 | A1 | 4/2018 | Lee et al. |
| 2018/0202616 | A1 | 7/2018 | Yoon et al. |
| 2018/0284613 | A1 | 10/2018 | Hirayama et al. |
| 2019/0295996 | A1 | 9/2019 | Park et al. |
| 2019/0333964 | A1 | 10/2019 | Lee et al. |
| 2021/0172572 | A1 | 6/2021 | Yoon et al. |
| 2021/0263345 | A1 | 8/2021 | Jung et al. |

FOREIGN PATENT DOCUMENTS

| | | |
|---|---|---|
| KR | 10-0703524 B1 | 4/2007 |
| KR | 10-2014-0045347 | 4/2014 |
| KR | 10-2017-0095418 | 8/2017 |
| KR | 10-2017-0096583 A | 8/2017 |
| KR | 10-1782889 B1 | 9/2017 |
| KR | 10-2018-0009015 A | 1/2018 |
| KR | 10-2018-0044158 | 5/2018 |
| KR | 10-2018-0063687 | 6/2018 |
| KR | 10-2018-0085849 | 7/2018 |
| KR | 10-2018-0036220 A | 9/2018 |
| KR | 2019-0012448 | 2/2019 |
| KR | 10-2019-0064396 | 6/2019 |
| WO | WO 2017/054898 A1 | 4/2017 |

* cited by examiner

PXa: PXa1, PXa2, PXa3

[FIG. 24]
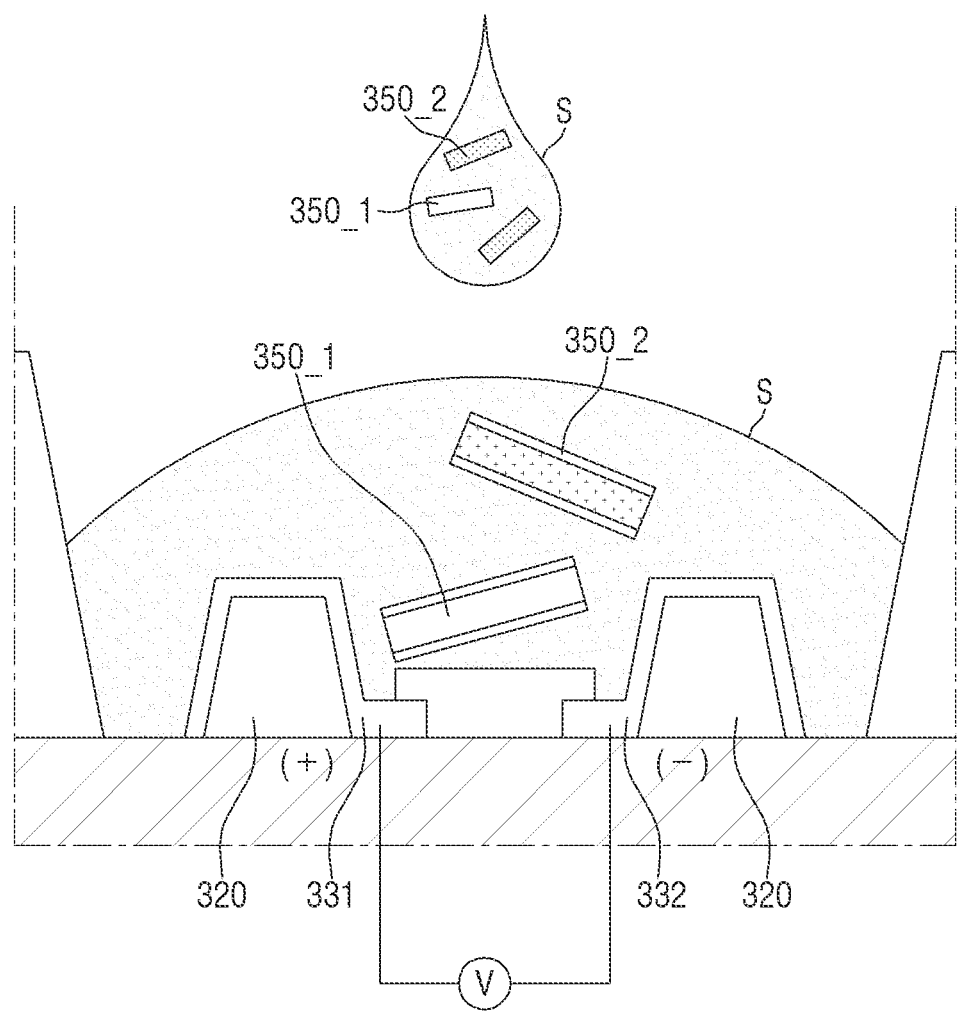

DISPLAY DEVICE

CROSS-REFERENCE TO RELATED APPLICATIONS

This application is a National Phase patent application of International Application Number PCT/KR2018/011307, filed on Sep. 21, 2018, which claims priority to Korean Patent Application Number 10-2018-0073582, filed on Jun. 26, 2018, the entire content of all of which is incorporated herein by reference.

TECHNICAL FIELD

The present disclosure relates to a display device, and for example, to a display device including the same kind of color conversion materials and a light-emitting unit employing inorganic light-emitting diodes.

BACKGROUND ART

Display devices become more and more important as multimedia technology evolves. Accordingly, a variety of types of display devices such as organic light-emitting display (OLED) devices and liquid-crystal display (LCD) devices are currently used.

Display devices are for displaying images and include a display panel such as an organic light-emitting display panel or a liquid-crystal display panel. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

An organic light-emitting diode (OLED) uses an organic material for the fluorescent material of the light-emitting elements. It is advantageous in that the fabricating process is simple and the element has flexibility. However, it is known that organic materials are vulnerable to high-temperature driving environments and the efficiency of blue light is relatively low.

DISCLOSURE

Technical Problem

Meanwhile, a display device may include a plurality of pixels, and the pixels may represent blue, green, and red, respectively. If the pixels use light-emitting elements that emit lights of different colors, the same process is repeated three times to align the light-emitting elements during the process of fabricating the display device. On the other hand, if the pixels include the light-emitting elements that emit light of the same color and color conversion layers are formed above the light-emitting elements, a process of aligning the light-emitting elements is carried out only once. However, a process of forming the color conversion layers is carried out at least twice. As the number of processes performed to align the light-emitting elements or to form the color conversion layers increases, the cost may increase and yield may decrease.

Aspects of the present disclosure provide a display device including color conversion layers containing the same kind of color conversion particles, and a light-emitting unit including two kinds of light-emitting elements.

Aspects of the present disclosure provide an approach to reduce the number of processes required to align light-emitting elements and to form color conversion layers to thereby save the fabrication cost of display devices and increase the fabrication yield.

It should be noted that aspects of the present disclosure are not limited to the above-mentioned aspects, and other unmentioned aspects of the present disclosure will be clearly understood by those skilled in the art from the following descriptions.

Technical Solution

According to an aspect of the present disclosure, a display device comprising a first pixel and a second pixel, the display device comprises a light-emitting layer, color conversion layers disposed on the light-emitting layer and color filter layers disposed on the color conversion layers, wherein the light-emitting layer comprises a first light-emitting element disposed in the first pixel, and a second light-emitting element disposed in the second pixel, wherein the color conversion layers comprise a first color conversion layer disposed in the first pixel and a second color conversion layer disposed in the second pixel, the color filter layers comprise a first color filter layer disposed in the first pixel and a second color filter layer disposed in the second pixel, the first light-emitting element and the second light-emitting element emit first light, a central wavelength range of the first light being a first wavelength, the first color conversion layer and the second color conversion layer contain color conversion particles that convert the first light into second light, a central wavelength range of the second light is a second wavelength longer than the first wavelength, the first color filter layer transmits the first light and blocks transmission of the second light, and the second color filter layer transmits the second light and blocks transmission of the first light.

The display device may further comprise a third pixel, wherein the light-emitting layer may further comprise a third light-emitting element disposed in the third pixel, wherein the color conversion layers may further comprise a third color conversion layer disposed in the third pixel, the color filter layer may further comprise a third color filter layer disposed in the third pixel, the third light-emitting element may emit third light, a central wavelength range of the third light being a third wavelength longer than the second wavelength, the third color conversion layer may contain the color conversion particles, and the third color filter layer blocks transmission of the first light and the second light and transmits the third light.

The third color filter layer may receive the third light.

The color conversion particles may do not convert a wavelength of the third light.

Each of the first color filter layer and the second color filter layer may receive a mixed light of the first light and the second light.

The color conversion particles may be dispersed in the first color conversion layer, the second color conversion layer and the third color conversion layer, and wherein a density of the color conversion particles dispersed in the second color conversion layer may be greater than a density of the color conversion particles of each of the first color conversion layer and the third color conversion layer.

An amount of the second light incident on the second color filter layer may be greater than an amount of the second light incident on the first color filter layer.

The central wavelength may range of the first light ranges from 430 nm to 470 nm, wherein the central wavelength may range of the second light ranges from 530 nm to 570 nm, and the color conversion particles may comprise quantum-dot materials.

At least a part of the first color conversion layer may overlap with the first light-emitting element, wherein at least a part of the second color conversion layer may overlap with the second light-emitting element, at least a part of the third color conversion layer may overlap with the third light-emitting element, and the color conversion particles may be disposed adjacent to at least one of the first light-emitting element, the second light-emitting element and the third light-emitting element.

The color conversion particles may be disposed to overlap with side surfaces of at least one side of the first light-emitting element, the second light-emitting element, and the third light-emitting element.

The light-emitting layer may further comprise a first partition wall disposed between the first light-emitting element and the second light-emitting element, and a second partition wall disposed between the second light-emitting element and the third light-emitting element.

At least a part of the first light emitted from the second light-emitting element and transmitted toward the first color conversion layer or the third color conversion layer may be reflected off the first partition wall and the second partition wall to be incident on the second color conversion layer.

The display device may comprise a first planarization layer disposed on the light-emitting layer to cover the first light-emitting element, the second light-emitting element and the third light-emitting element, a second planarization layer disposed under the color conversion layers to provide a flat lower surface of the color conversion layer, and an adhesive layer disposed between the first and second planarization layers, wherein the first planarization layer, the adhesive layer and the second planarization layer may be stacked on one another between the light-emitting layer and the color conversion layers.

According to an aspect of the present disclosure, a display device comprising a first pixel, a second pixel and a third pixel, the display device comprises a light-emitting layer, color conversion layers disposed on the light-emitting layer and color filter layers disposed on the color conversion layers, wherein the light-emitting layer comprises a first light-emitting element disposed in the first pixel, a second light-emitting element disposed in the second pixel, and a third light-emitting element disposed in the third pixel, the color conversion layers comprise a first color conversion layer disposed in the first pixel, a second color conversion layer disposed in the second pixel, and a third color conversion layer disposed on the third pixel, the color filter layers comprise a first color filter layer disposed in the first pixel, a second color filter layer disposed in the second pixel, and a third color filter layer disposed in the third pixel, the first light-emitting element, the second light-emitting element and the third light-emitting element emit mixed light of a first light having a first wavelength and a third light having a third wavelength, the third wavelength being longer than the first wavelength, the first color conversion layer, the second color conversion layer and the third color conversion layer contain color conversion particles that convert the first light into second light having a second wavelength, the second wavelength being longer than the first wavelength and shorter than the third wavelength, the first color filter layer transmits the first light and blocks transmission of the second light and the third light, the second color filter layer transmits the second light and blocks transmission of the first light and the third light, and the third color filter layer transmits the third light and blocks transmission of the first light and the second light.

A mixed light of the first light and the second light may be incident on each of the first color conversion layer, the second color conversion layer, and the third color conversion layer.

A mixed light of the first light, the second light and the third light may be incident on each of the first color filter layer, the second color filter layer, and the third color filter layer.

The color conversion particles may be dispersed in the first color conversion layer, the second color conversion layer and the third color conversion layer, and wherein a density of the color conversion particles dispersed in the second color conversion layer may be greater than a density of the color conversion particles of each of the first color conversion layer and the third color conversion layer.

An amount of the second light incident on the second color filter layer may be greater than an amount of the second light incident on the first color filter layer.

At least a part of the first color conversion layer may overlap with the first light-emitting element, wherein at least a part of the second color conversion layer may overlap with the second light-emitting element, at least a part of the third color conversion layer may overlap with the third light-emitting element, and the color conversion particles may be disposed adjacent to at least one of the first light-emitting element, the second light-emitting element and the third light-emitting element.

The display device may comprise a first planarization layer disposed on the light-emitting layer to cover the first light-emitting element, the second light-emitting element and the third light-emitting element, a second planarization layer disposed under the color conversion layers to provide a flat lower surface of the color conversion layer and an adhesive layer disposed between the first and second planarization layers, wherein the first planarization layer, the adhesive layer and the second planarization layer may be stacked on one another between the light-emitting layer and the color conversion layers.

The details of other embodiments are included in the detailed description and the drawings.

Advantageous Effects

The display device according to an embodiment includes a first light-emitting element that emits light of a first color, a second light-emitting element that emits light of a third color, and a color conversion layer that converts the light of the third color into light of a second color. Accordingly, in a display device that displays lights of the first color, the second color and the third color, the number of processes required for the same configuration can be reduced. Therefore, it is possible to save the process cost required for fabricating the display device and to improve the fabrication yield. In addition, it is possible to effectively compensate for the insufficient luminous efficiency for a specific light.

Advantageous effects according to the present disclosure are not limited to those mentioned above, and various other advantageous effects are included herein.

DESCRIPTION OF DRAWINGS

FIG. 24 is a view showing a process of aligning light-emitting elements in a light-emitting unit of the display device of FIG. 23.

MODES OF THE INVENTION/DETAILED DESCRIPTION

The present disclosure will now be described more fully hereinafter with reference to the accompanying drawings, in which embodiments of the disclosure are shown. The invention may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments of the present disclosure will be described with reference to the accompanying drawings.

Figure 1:
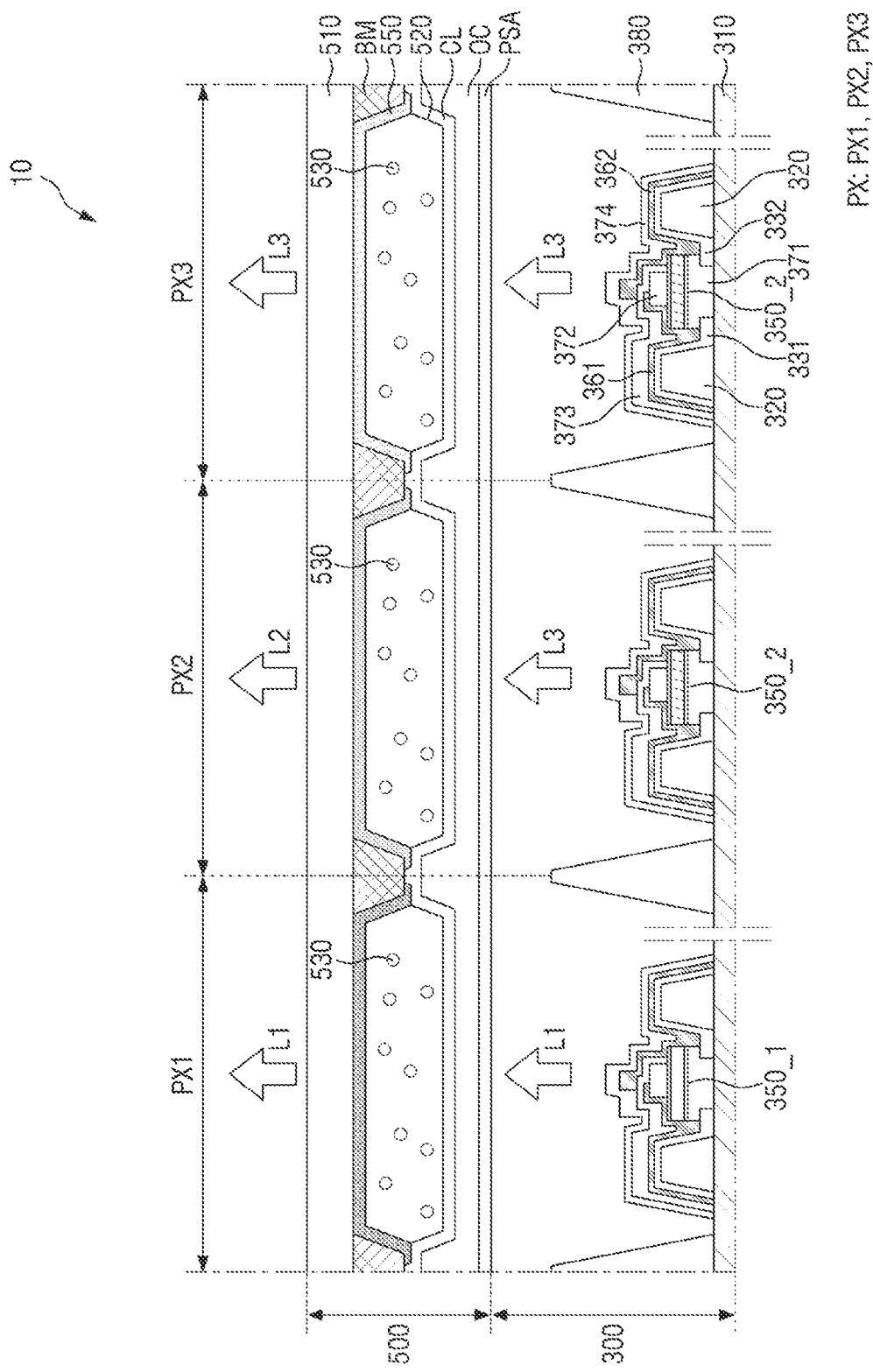
FIG. 1 is a cross-sectional view of a display device according to an embodiment of the present disclosure.

FIG. 1 is a cross-sectional view of a display device according to an embodiment of the present disclosure.

Referring to FIG. 1, a display device 10 may include a plurality of pixels PX. The plurality of pixels PX may be disposed on a display area of the display device 10 and they may represent light of respective wavelength bands emitted to the outside of the display device 10. Although three pixels PX1, PX2 and PX3 are depicted in FIG. 1 by way of example, it is to be understood that the display device 10 may include more than three pixels.

The plurality of pixels PX may emit light of different respective colors. For example, a first pixel PX1 may emit light of a first color L1, a second pixel PX2 may emit light of a second color L2, and a third pixel PX3 may emit light of a third color L3. It is, however, to be understood that the present disclosure is not limited thereto. In some implementations, adjacent pixels PX may emit light of the same color. In the following description, it is assumed that the first pixel PX1, the second pixel PX2 and the third pixel PX3 emit lights of different colors as described above.

According to an embodiment of the present disclosure, the central wavelength range of the first color L1 is longer than the central wavelength range of the second color L2, and the central wavelength range of the second color L2 is longer than the central wavelength range of the third color L3. For example, the first color L1 may be red having a central wavelength range in the range of approximately 610 nm to 650 nm, the second color L2 may be green having a central wavelength range in the range of approximately 530 nm to 570 nm, and the third color L3 may be blue having a central wavelength range in the range of approximately 430 nm to 470 nm. It is, however, to be understood that the present disclosure is not limited thereto. The first color L1, the second color L2 and the third color L3 are not particularly limited as long as they have different center wavelength bands. In the following description, the first color L1 is red, the second color L2 is green, and the third color L3 is blue, and the first pixel PX1 emits red L1, the second pixel PX2 emits green L2, and the third pixel PX emits blue L3.

The display device 10 according to the embodiment of the present disclosure may include a light-emitting unit 300 that provides lights of respective wavelength bands, and a color-converting unit 500 that converts the lights provided from the light-emitting unit 300 into light of a different wavelength band.

The light-emitting unit 300 and the color-converting unit 500 include portions overlapping a plurality of pixels PX of the display device 10. In FIG. 1, the light-emitting unit 300 is briefly depicted for convenience of illustration. For convenience of illustration, a portion of the light-emitting unit 300 that overlaps with the first pixel PX1 is defined as a first pixel area PXa1, a portion of the light-emitting unit 300 that overlaps with the second pixel PX2 is defined as a second pixel area PXa2, and a portion of the light-emitting unit 300 that overlaps with the third pixel PX3 is defined as a third pixel area PXa3. A portion of the color-converting unit 500 that overlaps with the first pixel PX1 is defined as a first pixel layer PXb1, a portion of the color-converting unit 500 that overlaps with the second pixel PX2 is defined as a second pixel layer PXb2, and a portion of the color-converting unit 500 that overlaps with the third pixel PX3 is defined as a third pixel layer PXb3.

The light-emitting unit 300 may include the light-emitting elements 350 to emit lights of respective wavelength bands to provide them to the color-converting unit 500. The light-emitting unit 300 will be described in more detail with reference to FIGS. 2 and 3.

Figure 2:
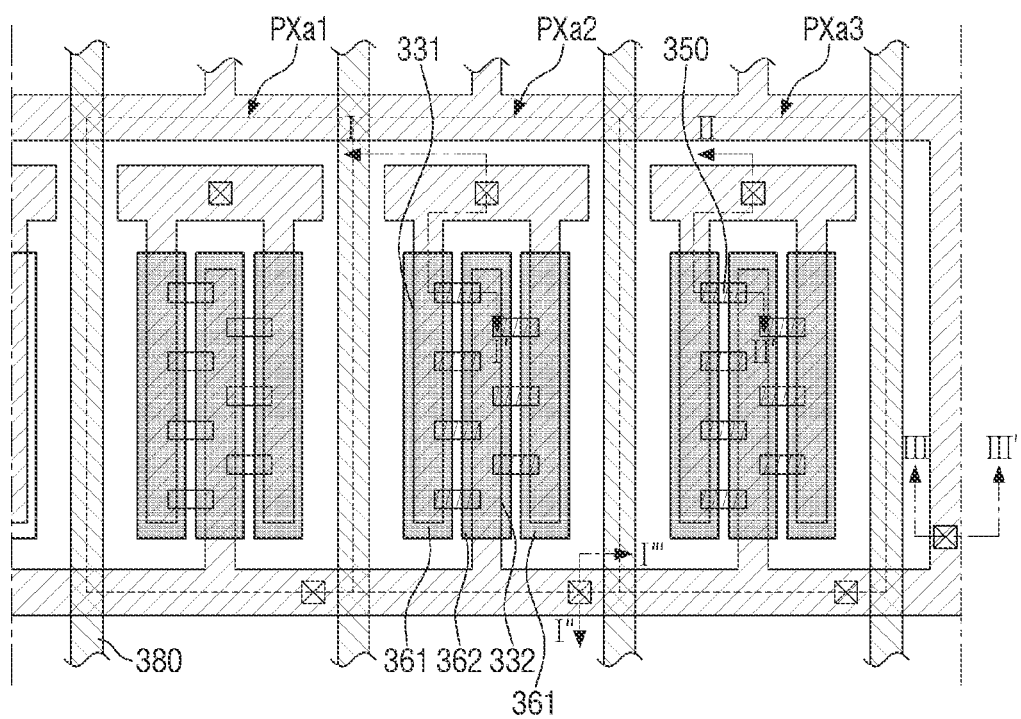
FIG. 2 is a plan view showing a light-emitting unit of a display device according to an embodiment of the present disclosure.
Figure 3:
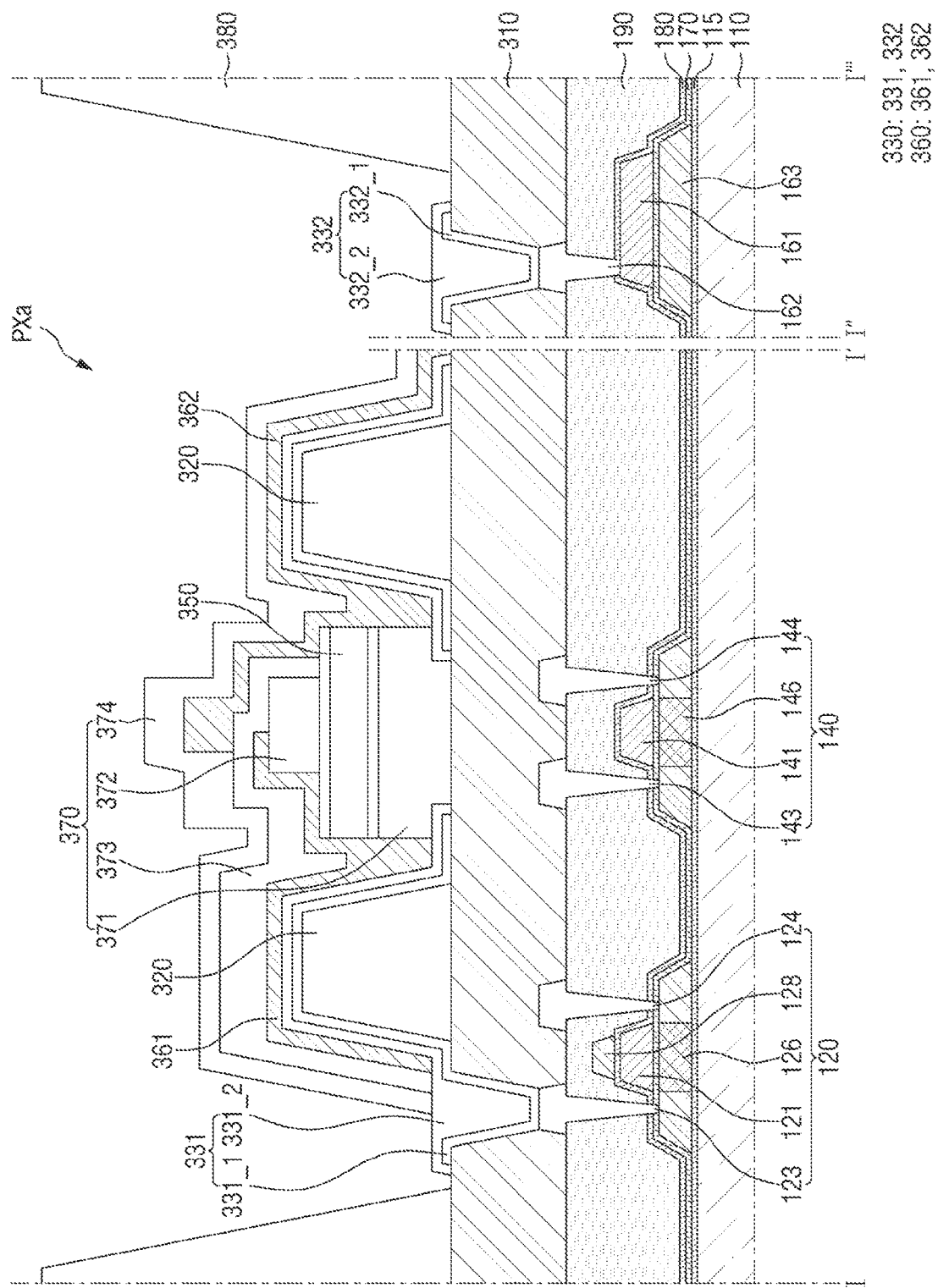
FIGS. 3 and 4 are cross-sectional views of a light-emitting unit according to an embodiment of the present disclosure.

FIG. 2 is a plan view showing a light-emitting unit of a display device according to an embodiment of the present disclosure. FIG. 3 is a cross-sectional view of a light-emitting unit according to an embodiment of the present disclosure. FIG. 3 is a cross-sectional view taken along lines I-I' and I"-I" in FIG. 2. Although FIG. 3 shows only one pixel area PXa of the light-emitting unit 300, it is to be understood that the description can be equally applied to other pixel portions as well.

The light-emitting unit 300 includes the light-emitting elements 350 that emit lights of respective wavelength bands. The light-emitting elements 350 in the plurality of pixel areas PXa may emit lights of different wavelength bands. For example, as the light-emitting elements 350 emit lights in the blue, green, or red wavelength bands, the plurality of pixel areas PXa may emit blue, green, or red light, respectively. It is, however, to be understood that the present disclosure is not limited thereto. In some implementations, the plurality of light-emitting elements 350 may emit light of the wavelength band of the same color so that the pixel areas PXa emit light of the same color (e.g., blue). In addition, the light-emitting elements 350 that emit lights of wavelength bands of different colors may be disposed in a single pixel area PXa, to emit light of a different color.

The light-emitting unit 300 includes a base layer 310, a plurality of electrodes 331, 332 disposed on the base layer 310, contact electrodes 361, 362 disposed on electrodes 331, 332, and the plurality of light-emitting elements 350 connected to the contact electrodes 361, 362. Each of the plurality of pixel areas PXa may further include a first partition wall 380 to distinguish it from adjacent pixel areas PXa.

The light-emitting unit 300 includes a base layer 310, and a first electrode 331 and a second electrode 332 that are spaced apart from each other on the base layer 310 to face each other. Second partition walls 320 may be disposed on the base layer 310. The second partition wall 320 may be disposed on the inner side of the first partition wall 380. The first electrode 331 and the second electrode 332 may be disposed on the second partition walls 320 to cover them, respectively. The second partition walls 320 may be made of, but are not limited to, an organic material such as polyimide.

The light-emitting elements 350 may be disposed between the first electrode 331 and the second electrode 332 spaced apart from each other. Although the first electrode 331 and the second electrode 332 are disposed directly on the base layer 310 in the example shown in FIG. 3, the present disclosure is not limited thereto. Other layers or features may be disposed between the base layer 310 and the first and second electrodes 331 and 332.

The light-emitting elements 350 may emit lights of different colors depending on the material of an active material layer 353. Different types of light-emitting elements 350 may be aligned in the pixel areas PXa, and thus, lights of different colors may be emitted from the pixel areas PXa of the light-emitting unit 300. It is to be noted that when the light-emitting elements 350 are disposed by using a dielectrophoresis (DEP) technique, the same process has to be repeated several times. As a result, the process cost may be increased, and the yield may be decreased. In view of the above, the light-emitting unit 300 of the display device 10 according to the embodiment of the present disclosure includes the light-emitting elements 350 emitting fewer kinds of colors to thereby reduce the number of processes to be repeated. The display device 10 according to an embodiment may include a first light-emitting element 350_1 emitting red light L1 and a second light-emitting element 3502 emitting blue light L3. A detailed description thereon will be given later.

The base layer 310 may support structures disposed thereon, for example, the second partition walls 320, the electrodes 331, 332, the light-emitting elements 350, and the first partition walls 380. The base layer 310 may include an insulating material. The base layer 310 may include an inorganic material or an organic material. In some embodiments, a glass substrate, a crystal substrate, a sapphire substrate, a plastic substrate and a flexible polymer film are employed as the base layer 310, and the substrate may be laminated with circuitry thereunder.

The first electrode 331 and the second electrode 332 may be disposed on the base layer 310 to be spaced apart from each other. Each of the first electrode 331 and the second electrode 332 may receive an electric signal. For example, the first electrode 331 may be connected to a first drain electrode 123 thereunder through a first contact hole penetrating the base layer 310 to receive a driving voltage therefrom. The second electrode 332 may be electrically connected to a connection line 162 thereunder through a second contact hole penetrating the base layer 310 to receive a supply voltage therefrom. As an electric current flows in the light-emitting element 350 disposed between the first electrode 331 and the second electrode 332 by the electrical signal applied thereto, the light-emitting element 350 can emit light.

The first electrode 331 may be spaced apart from the second electrode 332 by a predetermined distance, which is equal to or less than the length of the light-emitting element 350. Accordingly, electrical contact between the light-emitting element 350 and the first and second electrodes 331 and 332 can be made easily and reliably.

There may be one or more first electrodes 331 and second electrodes 332. The first electrodes 331 and the second electrodes 332 may be arranged alternately in each of the pixel areas PXa. In order to dispose the first electrodes 331 and the second electrodes 332 so that they face each other, the number of the first electrodes 331 may be equal to the number of the second electrodes 332, or there may be either one more first electrode 331 or one more second electrode 332 than the other. Although two first electrodes 331 and one second electrode 332 are disposed in each of the pixel areas PXa in the example shown in FIG. 2, the present disclosure is not limited thereto.

It is to be noted that only one first electrode 331 and one second electrode 332 are depicted while the other first electrode 331 is omitted in the cross-sectional views of FIGS. 1, 3A and the other figures for convenience of illustration. The structure between the other first electrode 331 and the second electrode 332 may be substantially identical to the structure between the first electrode 331 and the second electrode 332 shown in the drawings. It is, however, to be understood that the present disclosure is not limited thereto, and the structure may be partially altered.

The second electrodes 332 disposed in the respective pixel areas PXa may be electrically connected with one another. As shown in FIG. 2, the ends of the second electrodes 332 disposed in the respective pixel areas PXa may be connected with a single line. Accordingly, the same electrical signal may be applied to the pixel areas PXa included in the display device 10 through the second electrodes 332.

On the other hand, the first electrode 331 may not be electrically connected to the first electrode 331 of another adjacent pixel area PXa. Accordingly, even if the same electric signal is applied from the second electrode 332, different electric signals may be applied to the first electrodes 331 of the pixel areas PXa so that they can be driven individually. However, when more than one first electrode 331 is disposed in a single pixel area PXa, the plurality of first electrodes 331 disposed together in the pixel area PXa may be electrically connected with each other. Accordingly, the same electrical signal may be applied to the light-emitting elements 350 in the single pixel area PXa.

The first electrode 331 may include a reflective layer 331_1 formed on the second partition wall 320, and an electrode layer 331_2, and the second electrode 332 may include a reflective layer 332_1 formed on the second partition wall 320, and an electrode layer 332_2.

The reflective layers 331_1 and 332_1 may reflect light emitted from the light-emitting element 350 to transmit the light toward the outside of the display device 10. Light exiting from the light-emitting element 350 radiates in all directions without directivity. The light traveling toward the reflective layers 331_1 and 332_1 may be reflected off there and may be transmitted to the outside of the display device, e.g., to the upper side of the reflective layers 331_1 and 332_1. By doing so, light emitted from the light-emitting element 350 can be concentrated in one direction to increase luminous efficiency. The reflective layers 331_1 and 3321 may include a material having high reflectance to reflect the light emitted from the light-emitting element 350. For example, the reflective layers 331_1 and 332_1 may include, but are not limited to, materials such as silver (Ag) and copper (Cu).

The electrode layers 331_2 and 332_2 are formed on the reflective layers 331_1 and 332_1, respectively. The electrode layers 331_2 and 332_2 may transmit electrical signal applied thereto to the contact electrodes 361, 362. The electrode layers 331_2 and 332_2 may include a transparent conductive material. For example, the electrode layers 331_2 and 332_2 may include, but are not limited to, a material such as indium tin oxide (ITO), indium zinc oxide (IZO) and indium tin zinc oxide (ITZO).

The electrode layers 331_2 and 332_2 may transmit electrical signals transmitted to the reflective layers 331_1 and 332_1, respectively, to the contact electrodes to be described later. The electrode layers 331_2 and 332_2 may include a transparent conductive material. For example, the electrode layers 331_2 and 332_2 may include, but are not limited to, a material such as indium tin oxide (ITO), indium zinc oxide (IZO) and indium tin zinc oxide (ITZO). In some embodiments, each of the reflective layers 331_1 and 332_1 and the electrode layers 331_2 and 332_2 may have a structure in which at least one transparent conductive layer such as ITO, IZO and ITZO and at least one metal layer such as silver and copper are stacked on one another. For example, the reflective layers 331_1 and 332_1 and the electrode layers 331_2 and 332_2 may form a stack structure of ITO/silver (Ag)/ITO.

According to an embodiment of the present disclosure, the electrode layers 331_2 and 332_2 have substantially the same shape as the reflective layers 331_1 and 332_1, but the electrode layers 331_2 and 332_2 have a larger size (or width) than the reflective layers 31_1 and 332_1, so that the electrode layers 331_2 and 332_2 may cover the side surfaces as well as the upper surface of the reflective layers 331_1 and 332_1. It is, however, to be understood that the present disclosure is not limited thereto.

First and second contact electrodes 361 and 362 may be disposed on the upper surfaces of the electrode layers 331_2 and 332_2 to transmit an electrical signal applied thereto. The first contact electrode 361 and the second contact electrode 362 may be connected to the first semiconductor layer 351 and the second semiconductor layer 352 of the light-emitting element 350, respectively. Accordingly, the first contact electrode 361 and the second contact electrode 362 may transmit an electric signal applied to the electrode layers 331_2 and 332_2 to the light-emitting element 350, so that light can be emitted. In the following drawings, for convenience of illustration, the electrode layers 331_2 and 332_2 and the reflective layers 331_1 and 332_1 are not distinguished, and only the first electrode 331 and the second electrode 332 are shown.

The first contact electrode 361 and the second contact electrode 362 may include a conductive material. For example, the contact electrodes may include ITO, IZO, ITZO, aluminum (Al), etc. It is, however, to be understood that the present disclosure is not limited thereto.

The first contact electrode 361 and the second contact electrode 362 may include the same material as the electrode layers 331_2 and 332_2. The first contact electrode 361 and the second contact electrode 362 may be disposed in the same pattern on the electrode layers 331_2 and 332_2 so that they can be brought into contact with them. The first contact electrode 361 and the second contact electrode 362 brought into contact with the electrode layers 331_2 and 332_2 may receive electrical signals applied to the electrode layers 331_2 and 332_2 and transmit them to the light-emitting element 350.

The first electrode 331, the second electrode 332, the light-emitting element 350, the first contact electrode 361 and the second contact electrode 362 may be covered by a plurality of insulating material layers 370.

The plurality of insulating material layers 370 may include a first insulating material layer 371, a second insulating material layer 372, a third insulating material layer 373, and a fourth insulating material layer 374.

The first insulating material layer 371 may be disposed between the first electrode 331 and the second electrode 332. As shown in FIG. 3, the first insulating material layer 371 may be disposed between the first electrode 331 and the second electrode 332, and the light-emitting element 350 may be disposed thereon. The first insulating material layer 371 can protect the electrode layers 331_2 and 332_2 of the first electrode 331 and the second electrode 332, and also can prevent the semiconductor layers 351 and 352 of the light-emitting element 350 from being in contact with other elements, thereby preventing damage to the light-emitting element 350.

One surface of the first insulating material layer 371 may be in contact with the base layer 310 while the light-emitting element 350 may be disposed on the opposite surface. The electrode layers 331_2 and 332_2 may be in contact with both sides of the first insulating material layer 371, respectively, so that the electrode layers 331_2 and 332_2 can be electrically insulated. Although the first insulating material layer 371 has a rectangular shape with the linear side surfaces in the cross-sectional view of FIG. 3, the present disclosure but is not limited thereto. The surfaces of the first insulating material layer 371 in contact with the electrode layers 331_2 and 332_2 may be aligned with both side portions of the light-emitting element 350, respectively, but the present disclosure is not limited thereto. The length of the first insulating material layer 371 may be larger than the length of the light-emitting element 350, and thus the both side portions of the first insulating material layer 371 may protrude when viewed from the top. As a result, the first insulating material layer 371 and the light-emitting element 350 may be stacked like stairs. In such case, the surface of each of the first contact electrode 361 and the second contact electrode 362 that is in contact with the side surface of the light-emitting element 350 may have a smooth shape.

In addition, a second insulating material layer 372 may be disposed to protect the light-emitting element 350 and electrically insulate the first contact electrode 361 and the second contact electrode 362. The second insulating material layer 372 may be disposed on the light-emitting element 350 and may be recessed from the side surfaces of the light-emitting element 350 toward the center. In other words, the length of the second insulating material layer 372 may be shorter than that of the light-emitting element 350. Like the first insulating material layer 371, as the second insulating material layer 372 is disposed, the surface of each of the first contact electrode 361 and the second contact electrode 362 that is in contact with the side surface of the light-emitting element 350 may have a smooth shape.

The third insulating material layer 373 may be disposed on the first contact electrode 361 to electrically insulate it from the second contact electrode 362. The third insulating material layer 373 may be disposed to cover the first contact electrode 361 and might not overlap with a part of the light-emitting element 350 so that the light-emitting element 350 can be connected to the second contact electrode 362.

The fourth insulating material layer 374 may be formed on the third insulating material layer 373 and the second contact electrode 362 to work as a protective layer against the external environment. If the contact electrodes 361, 362 are exposed, the electrodes may be damaged and thus the contact electrode material may be disconnected. To prevent this, the fourth insulating material layer 374 may cover them. That is to say, the fourth insulating material layer 374 may be disposed to cover the first electrode 331, the second electrode 332 and the light-emitting element 350 of the light-emitting unit 300.

Each of the first insulating material layer 371, the second insulating material layer 372, the third insulating material layer 373 and the fourth insulating material layer 374 may include a material such as silicon oxide (SiOx), silicon nitride (SiNx), silicon oxynitride (SiOxNy), aluminum oxide (Al2O3) and aluminum nitride (AlN). The first insulating material layer 371, the second insulating material layer 372, the third insulating material layer 373 and the fourth insulating material layer 374 may be made of either the same material or different materials. Besides, any of a variety of materials that have insulation properties may be applicable to the first insulating material layer 371, the second insulating material layer 372, the third insulating material layer 373 and the fourth insulating material layer 374.

One or more first partition walls 380 may be disposed on the base layer 310 to separate the plurality of pixel areas PXa of the light-emitting unit 300 from one another. The first partition walls 380 may be spaced apart from one another, and the first electrode 331, the second electrode 332 and the light-emitting element 350 may be disposed between the first partition walls 380 spaced apart from one another, as shown in FIG. 2. In addition, the first partition walls 380 may be formed to cover electrode lines.

In the light-emitting unit 300, the pixel areas PXa are divided by the first partition walls 380 with respect to the light-emitting element 350 emitting light of a respective wavelength. The first partition walls 380 may be disposed between the pixel areas PXa to prevent the light-emitting element 350 from moving to another adjacent pixel area PXa when aligning the light-emitting element 350. For example, the first partition walls 380 may be, but are not limited to, polyimide (PI). The first partition walls 380 may have a hydrophobic surface.

It is, however, to be understood that the present disclosure is not limited thereto. The first partition walls 380 may distinguish a plurality of pixel areas PXa from another plurality of pixel areas PXa. That is to say, a plurality of pixel areas PXa may be disposed in an area formed by the first partition walls 380. When a plurality of pixel areas PXa includes the light-emitting elements 350 that emit light of the same color, the same light-emitting elements 350 may be aligned together in the plurality of pixel areas PXa. In such case, the light-emitting elements 350 may move to the adjacent pixel area PXa, and thus the pixel areas PXa may not be divided by the first partition walls 380.

In addition, the first partition walls 380 can prevent color mixing of light emitted from the light-emitting elements 350. When adjacent pixel areas PXa include the light-emitting elements 350 that emit light of different wavelength bands, the lights emitted from the pixel areas PXa may be mixed. To prevent this, the first partition wall 380 may be disposed between the pixel areas PXa on the light-emitting unit 300 so that light emitted from one pixel area PXa does not entering another pixel area PXa to thereby prevent color mixing. In this manner, the color gamut of the display device 10 can be improved.

In addition, in order to provide a flat upper surface of the light-emitting unit 300, a planarization layer OC covering the elements may be further included. As will be described later, when the light-emitting unit 300 and the color-converting unit 500 are produced via different processes and then they are attached together to fabricate the display device 10, it is suitable to make the interface between the light-emitting unit 300 and the color-converting unit 500 flat. To this end, the light-emitting unit 300 may include the planarization layer OC (see FIG. 2) to have a flat upper surface.

In some embodiments, the display device 10 may further include circuitry electrically connected to the light-emitting element 350 and controlling the emission of the light-emitting element 350 as shown in FIG. 3. The circuitry may include at least one thin-film transistor and at least one capacitor.

For example, the circuitry may be disposed under the light-emitting unit 300.

The circuitry may include an insulating substrate 110, a buffer layer 115 disposed on the insulating substrate 110, a first thin-film transistor 120 disposed on the buffer layer 115, a second thin-film transistor 140, and a power line 161. The configuration of the circuitry is not limited thereto. It may include two or more thin-film transistors and one or more capacitors, and thus may have various structures.

The first thin-film transistor 120 includes a first active layer 126, a first gate electrode 121, a first drain electrode 123, and a first source electrode 124. A first gate insulating layer 170 may be disposed between the first gate electrode 121 and the first active layer 126 to insulate them from each other. A second gate insulating layer 180 and an interlayer dielectric layer 190 may be disposed between the first gate electrode 121 and the first drain electrode 123 and between the first gate electrode 121 and the first source electrode 124. A capacitor electrode 128 may be disposed between the second gate insulating layer 180 and the interlayer dielectric layer 190. The capacitor electrode 128 may form a storage capacitor with the first gate electrode 121. The first thin-film transistor 120 may be disposed below the light-emitting element 350 and may partially overlap the light-emitting element 350. The first thin-film transistor 120 may be a driving thin-film transistor for driving the light-emitting element 350.

The second thin-film transistor 140 includes a second active layer 146, a second gate electrode 141, a second drain electrode 143, and a second source electrode 144. The first gate insulating layer 170 may be disposed between the second gate electrode 141 and the second active layer 146 to insulate them from each other. The second gate electrode 141 may overlap a part of the second active layer 146 on the first gate insulating layer 170. The second gate insulating layer 180 and the interlayer dielectric layer 190 may be disposed between the second gate electrode 141 and the second drain electrode 143 and between the second gate electrode 141 and the second source electrode 144. The second thin-film transistor 140 may be disposed below the light-emitting element 350 and may partially overlap the light-emitting element 350. The second thin-film transistor 140 may be a switching thin-film transistor.

Figure 4:
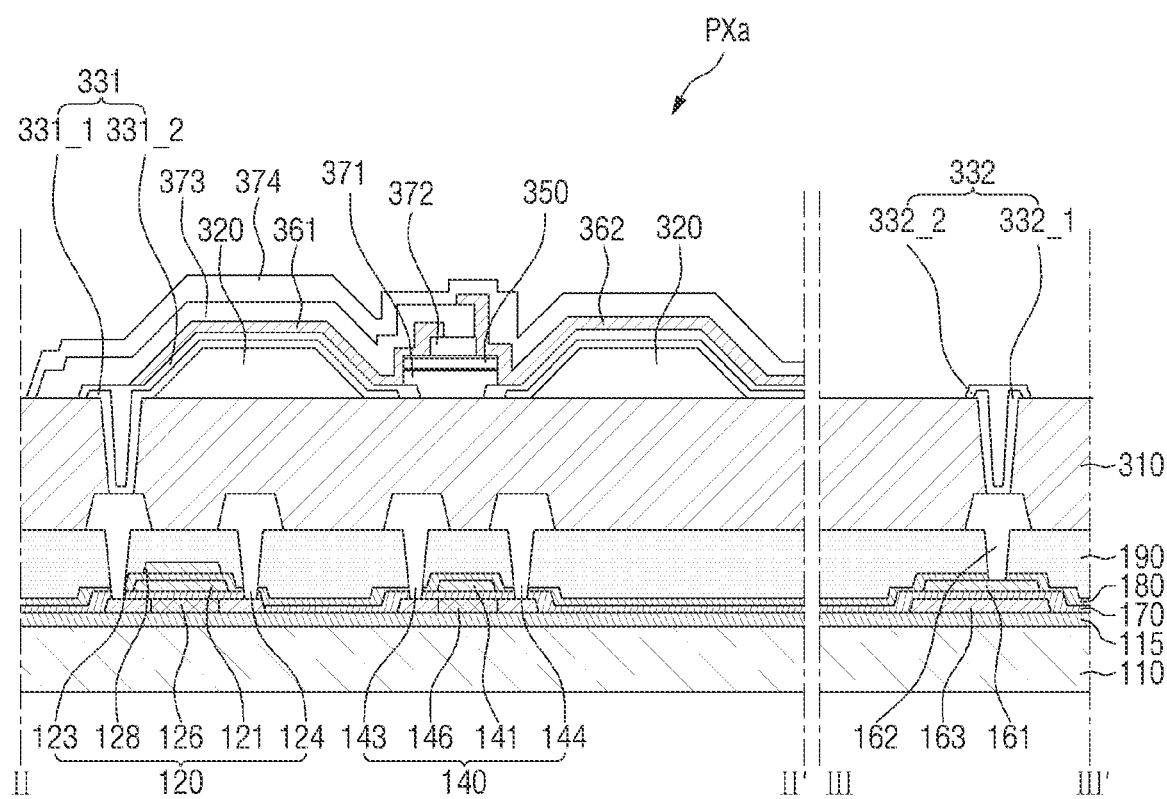

It is, however, to be understood that the present disclosure is not limited thereto. The second thin-film transistor 140 may be disposed so that it does not overlap the light-emitting element 350. FIG. 4 is a cross-sectional view taken along lines II-II' and III-III' of FIG. 2. Referring to FIG. 4, the power line 161 may be disposed outside the pixel area PXa of the light-emitting unit 300. For example, as shown in FIG. 2, the power line 161 may be disposed in an area other than the pixel areas PXa of the light-emitting unit 300 (e.g., an area where line III-III' is drawn). The light-emitting element 350 may be in contact with the power line 161 on a line extended from the second electrode 332 in the area other than the pixel areas PXa.

The power line 161 may be disposed on the same layer as the first gate electrode 121 of the first thin-film transistor 120 and the second gate electrode 141 of the second thin-film transistor 140. The power line 161 may be electrically connected to the second electrode 332 using the connection line 162. Accordingly, the second electrode 332 may be electrically connected to the power line 161 to receive power from the power line 161. An auxiliary layer 163 may be disposed under the power line 161 to reduce a level difference with the surrounding area. The auxiliary layer 163 is not an essential element and may be eliminated.

The first gate insulating layer 170 may be disposed on the buffer layer 115 to cover the first active layer 126 and the second active layer 146. The second gate insulating layer 180 may be disposed on the first gate insulating layer 170 to cover the first gate electrode 121 and the second gate electrode 141.

The interlayer dielectric layer 190 may be made up of a single layer or multiple layers including an organic material or an inorganic material and may be disposed on the second gate insulating layer 180. It is to be noted that the second gate insulating layer 180 or the interlayer dielectric layer 190 may be eliminated.

The first drain electrode 123 and the first source electrode 124, and the second drain electrode 143 and the second source electrode 144 may be formed on the interlayer dielectric layer 190. The first drain electrode 123 and the first source electrode 124 may be connected to a drain region and a source region of the first active layer 126, respectively, through contact holes formed through the first gate insulating layer 170, the second gate insulating layer 180, and the interlayer dielectric layer 190. The second drain electrode 143 and the second source electrode 144 may be connected to a drain region and a source region of the second active layer 146, respectively, through contact holes formed through the first gate insulating layer 170, the second gate insulating layer 180, and the interlayer dielectric layer 190.

The first gate insulating layer 170 may cover the auxiliary layer 163, and the power line 161 overlapping the auxiliary layer 163 may be formed on the first gate insulating layer 170. The power line 161 may be made of the same material as the first gate electrode 121 and the second gate electrode 141 via the same process. It is, however, to be understood that the present disclosure is not limited thereto. The auxiliary layer 163 may be made of a different material from the first gate electrode 121 and the second gate electrode 141 via a separate process.

The second gate insulating layer 180 and the interlayer dielectric layer 190 may be disposed on the power line 161, and the connection line 162 may be formed on the interlayer dielectric layer 190. The connection line 162 may be electrically connected to the power line 161 through contact holes formed through the second gate insulating layer 180 and the interlayer dielectric layer 190.

As described above, a plurality of light-emitting elements 350 is disposed between the first electrode 331 and the second electrode 332. Each of the light-emitting elements 350 may include the active material layer to emit light of a respective wavelength band. The light-emitting elements 350 may emit light of different wavelengths, or may emit light of the same wavelength.

According to an embodiment of the present disclosure, the light-emitting elements 350 may be formed on a substrate by epitaxial growth. For example, a seed crystal layer for forming a semiconductor layer is formed on the substrate and then a desired semiconductor material is deposited and grown thereon. The crystal is grown on the seed crystal layer to form a plurality of semiconductor layers 351 and 352, thereby forming the light-emitting elements 350. Once the light-emitting elements 350 are formed, they may be separated from the substrate and aligned between the first electrode 331 and the second electrode 332. Hereinafter, the structures of the light-emitting elements 350 will be described in detail with reference to FIGS. 5 to 7.

Figure 5:
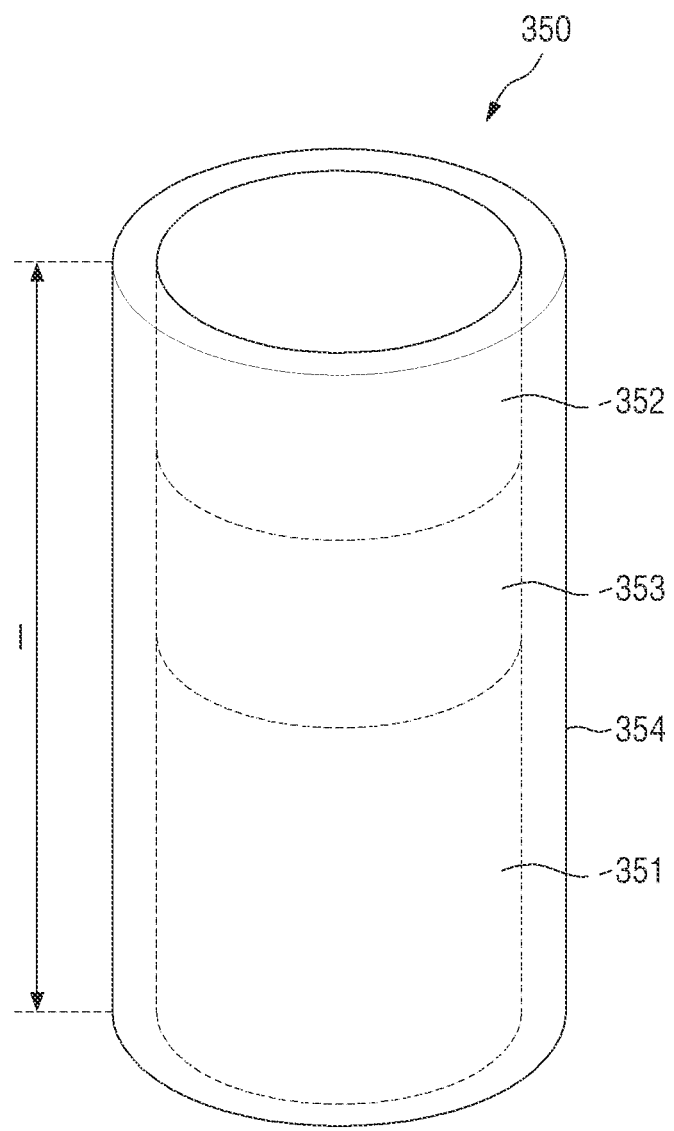
FIGS. 5 to 7 are views showing light-emitting elements according to embodiments of the present disclosure.
Figure 6:
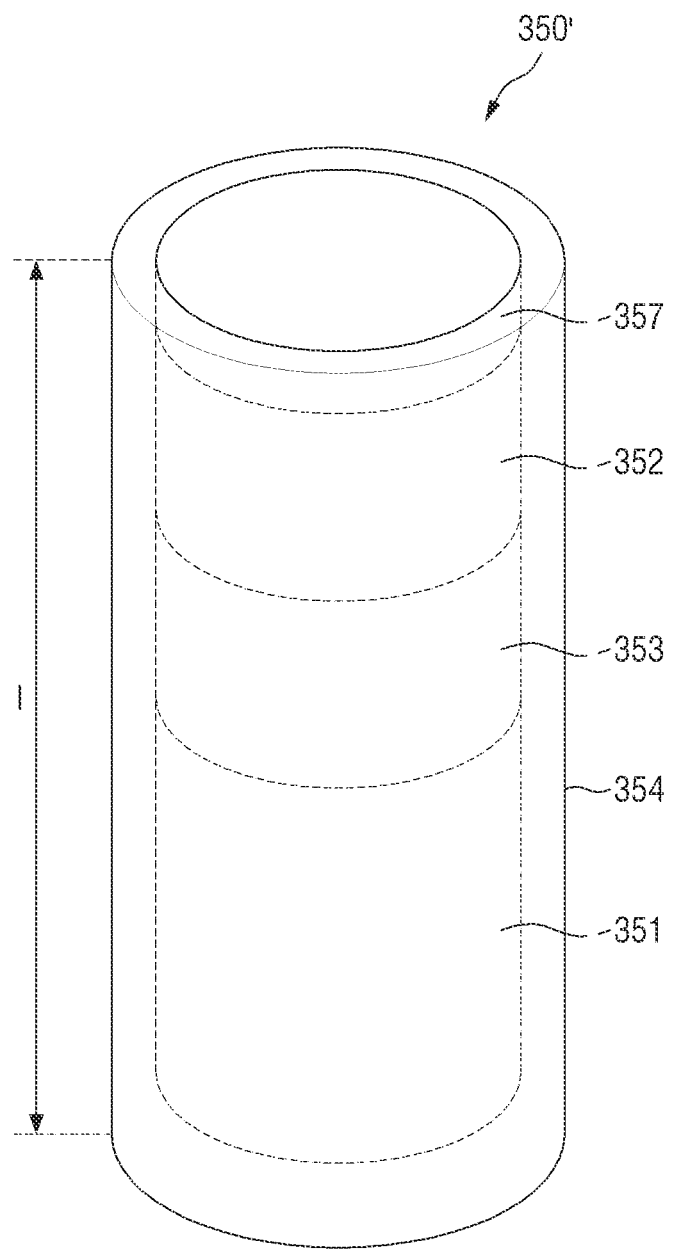
Figure 7:
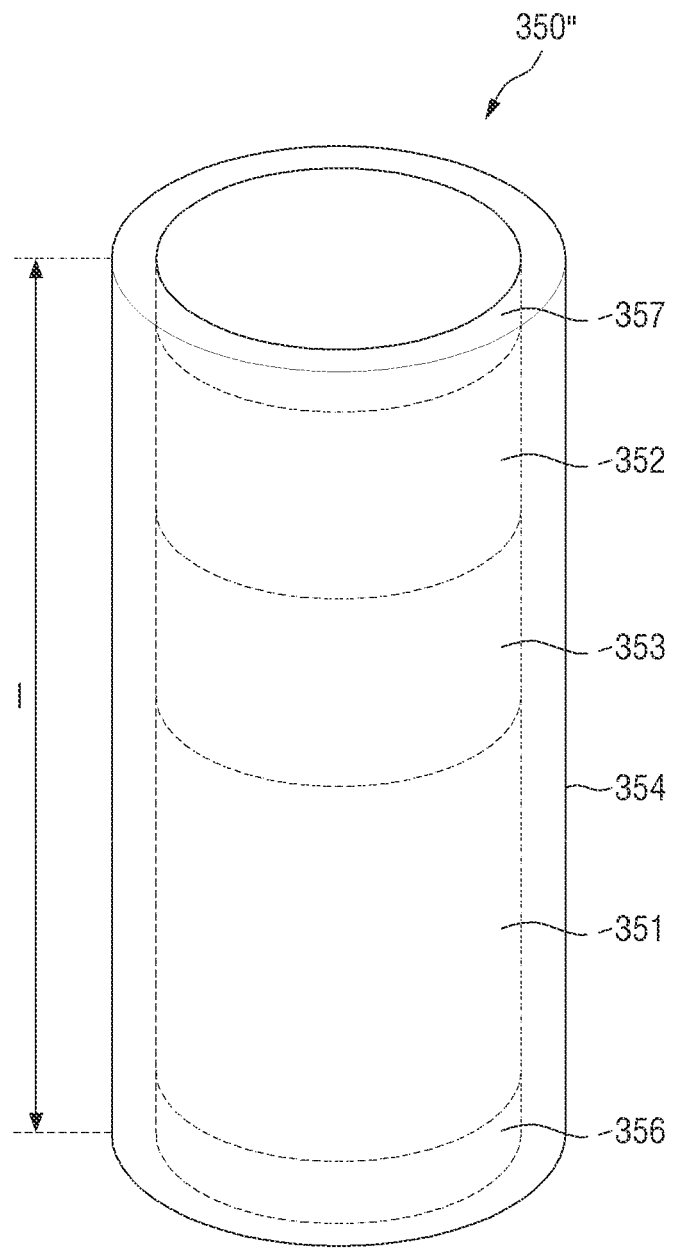

FIGS. 5 to 7 are views showing light-emitting elements according to embodiments of the present disclosure.

Initially, referring to FIG. 5, the light-emitting element 350 may include a plurality of semiconductor layers 351 and 352 and an active material layer 353 disposed between the plurality of semiconductor layers 351 and 352. An electric signal applied from the first electrode 331 and the second electrode 332 may be transmitted to the active material layer 353 via the plurality of semiconductor layers 351 and 352 to emit light.

For example, the light-emitting element 350 may include the first semiconductor layer 351, the second semiconductor layer 352, the active material layer 353 disposed between the first semiconductor layer 351 and the second semiconductor layer 352, and an insulating layer 354. FIG. 3 shows an example of the light-emitting element 350 having a structure in which the first semiconductor layer 351, the active material layer 353 and the second semiconductor layer 352 are stacked sequentially in the longitudinal direction.

The first semiconductor layer 351 may be an n-type semiconductor layer.

For example, when the light-emitting element 350 emits light of a blue wavelength band, the first semiconductor layer 351 may be a semiconductor material corresponding to the formula $In_xAl_yGa_{1-x-y}N$ ($0 \leq x \leq 1$, $0 \leq y \leq 1$, $0 \leq x+y \leq 1$). For example, it may be at least one of n-type doped InAlGaN, GaN, AlGaN, InGaN, AlN and InN. The first semiconductor layer 351 may be doped with a first conductivity-type dopant. For example, the first conductivity-type dopant may be Si, Ge, Sn, etc. The length of the first semiconductor layer 351 may range, but is not limited to, from 1.5 μm to 5 μm.

The second semiconductor layer 352 may be a p-type semiconductor layer. For example, when the light-emitting element 350 emits light of a blue wavelength band, the first semiconductor layer 352 may be a semiconductor material corresponding to the formula $In_xAl_yGa_{1-x-y}N$ ($0 \leq x \leq 2$, $0 \leq y \leq 1$, $0 \leq x+y \leq 1$). For example, it may be at least one of p-type doped InAlGaN, GaN, AlGaN, InGaN, AlN and InN. The second semiconductor layer 352 may be doped with a second conductivity-type dopant. For example, the second conductivity-type dopant may be Mg, Zn, Ca, Se, Ba, etc. The length of the second semiconductor layer 352 may range, but is not limited to, from 0.08 μm to 0.25 μm.

The active material layer 353 may be disposed between the first semiconductor layer 351 and the second semiconductor layer 352 and may include a material having a single or multiple quantum well structure. The active material layer 353 may emit light as electron-hole pairs are combined therein in response to an electrical signal applied through the first semiconductor layer 351 and the second semiconductor layer 352. For example, when the active material layer 353 emits light of the blue wavelength band, it may include a material such as AlGaN and AlInGaN. The active material layer 353 may include other Group III to Group V semiconductor materials depending on the wavelength band of emitted light. Accordingly, the light emitted from the active material layer 353 is not limited to the light of the blue wavelength band. The active material layer 353 may emit light of red or green wavelength band in some implementations. The length of the active material layer 353 may be, but is not limited to, in the range of 0.05 μm to 0.25 μm.

The light emitted from the active material layer 353 may exit through not only to the outer surfaces of the light-emitting element 350 in the longitudinal direction but also through both side surfaces. That is to say, the direction in which the light emitted from the active material layer 353 propagates is not limited to one direction.

The insulating layer 354 may be formed outside the light-emitting element 350 to protect it. For example, the insulating layer 354 may be formed so as to surround the side surface of the light-emitting element 350, and not at both ends of the light-emitting element 350 in the longitudinal direction, for example, where the first semiconductor layer 351 and the second semiconductor layer 352 are disposed. It is, however, to be understood that the present disclosure is not limited thereto. The insulating layer 354 may include materials having an insulating property such as silicon oxide (SiOx), silicon nitride (SiNx), silicon oxynitride (SiOxNy), aluminum nitride (AlN) and aluminum oxide ($Al_2O_3$). Accordingly, it is possible to prevent an electrical short-circuit that may be created when the active material layer 353 comes in contact with the first electrode 331 or the second electrode 332. In addition, since the insulating layer 354 may include the active material layer 353 to protect the outer surface of the light-emitting element 350, it is possible to prevent a decrease in luminous efficiency.

In some embodiments, the insulating layer 354 may be subjected to a surface treatment so that it is dispersed in the solution without being agglomerated with another insulating material layer. During the process of aligning the light-emitting elements 350 to be described below, the light-emitting elements 350 remain dispersed in the solution to be independently aligned between the first electrode 331 and the second electrode 332. For example, the surface of the insulating layer 354 may be treated to be hydrophobic or hydrophilic, so that it can remain dispersed in the solution.

The thickness of the insulating layer 354 may be, but is not limited to, in the range of 0.5 μm to 1.5 μm.

The light-emitting element 350 may be cylindrical. It is to be understood that the shape of the light-emitting element 350 is not limited thereto but may have various shapes such as a cube, a cuboid and a hexagonal column. The length of the light-emitting element 350 may range from 1 μm to 10 μm or from 2 μm to 5 μm, and preferably approximately 4 μm. The diameter of the light-emitting element 350 may range from 400 nm to 700 nm, and preferably approximately 500 nm.

Referring to FIGS. 6 and 7, a light-emitting element 350' may further include electrode material layers 356 and 357 on at least one of both side surfaces on which the first semiconductor layer 351 and the second semiconductor layer 352 are disposed.

In the example shown in FIG. 6, the light-emitting element 350' further includes a second electrode material layer 357 only on the second semiconductor layer 352. In the example shown in FIG. 7, a light-emitting element 350" further includes electrode material layers 356 and 357 on the first semiconductor layer 351 and the second semiconductor layer 352, respectively. For convenience of illustration, the electrode layer formed on the side on which the first semiconductor layer 351 is disposed is referred to as the first electrode material layer 356, and the electrode layer formed on the other side on which the second semiconductor layer 352 is disposed is referred to as the second electrode material layer 357. It is, however, to be understood that the present disclosure is not limited thereto. Either of the electrode layers may be referred to as a first electrode material layer.

According to the embodiments of the present disclosure, the light-emitting elements 350' and 350" may include at least one of the first electrode material layer 356 and the second electrode material layer 357, and the insulating layer 354 may be extended in the longitudinal direction to cover the first electrode material layer 356 and the second electrode material layer 357. It is, however, to be understood that the present disclosure is not limited thereto. The insulating layer 354 may cover only the first semiconductor layer 351, the active material layer 353 and the second semiconductor layer 352 or may cover only a part of the outer surface of each of the electrode material layers 356 and 357 so that the other part of the outer surface of each of the first electrode material layer 356 and the second electrode material layer 357 may be exposed.

The first electrode material layer 356 and the second electrode material layer 357 may be ohmic contact electrodes. It is, however, to be understood that the present disclosure is not limited thereto. The electrode material layers may be Schottky contact electrodes. The first electrode material layer 356 and the second electrode material layer 357 may include a conductive metal. For example, the first electrode material layer 356 and the second electrode material layer 357 may include at least one of aluminum (Al), titanium (Ti), indium (In), gold (Au) and silver (Ag). The first electrode material layer 356 and the second electrode material layer 357 may include the same material or different materials. It is, however, to be understood that the present disclosure is not limited thereto.

Referring back to FIG. 3, the above-described light-emitting element 350 may be disposed in the space between the first electrode 331 and the second electrode 332 are spaced apart from each other. The light-emitting element 350 may be disposed in the space by the dielectrophoresis (DEP) technique. Hereinafter, a method of aligning the light-emitting elements 350 will be described with reference to FIGS. 8 to 10.

Figure 8:
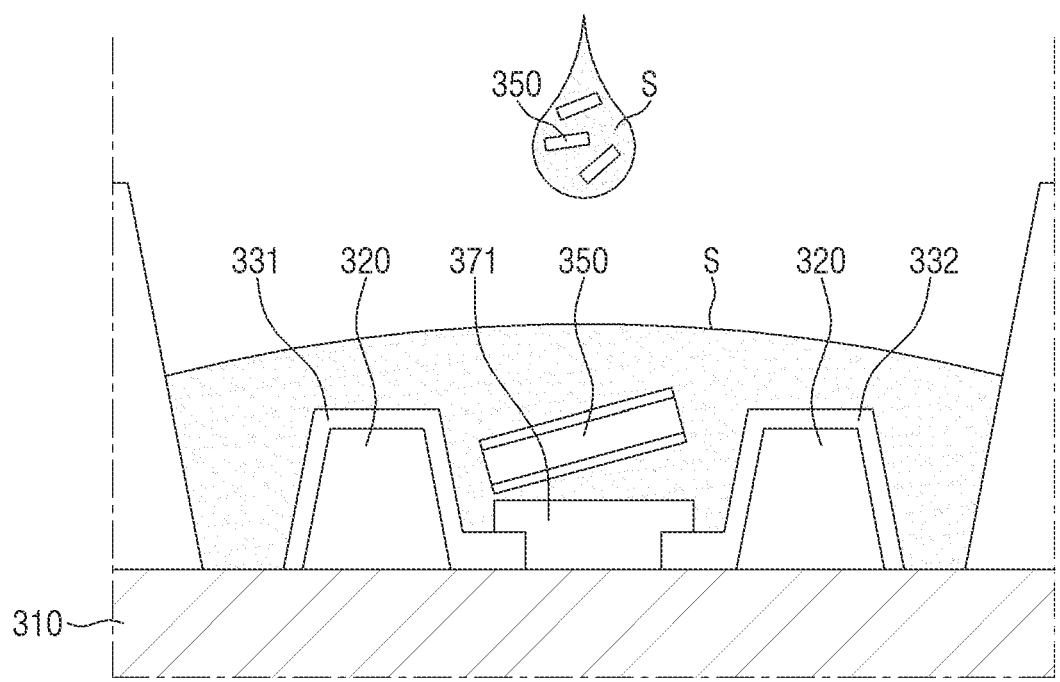
FIGS. 8 to 10 are views showing a method of aligning the light-emitting elements according to an embodiment of the present disclosure.
Figure 9:
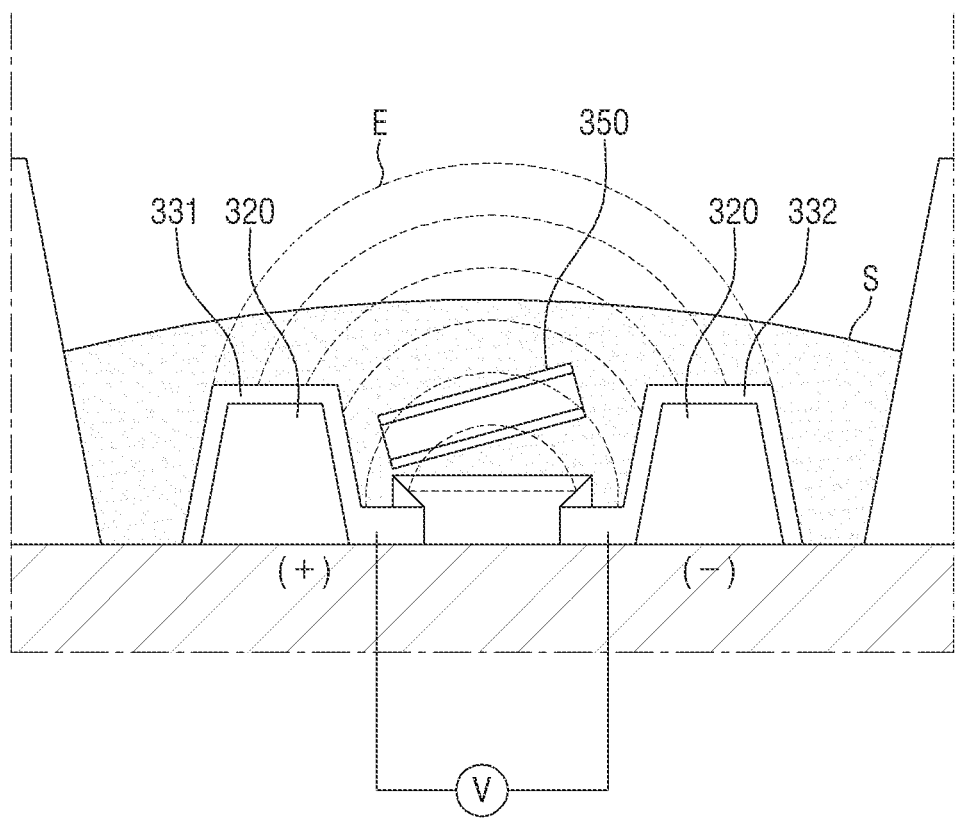
Figure 10:
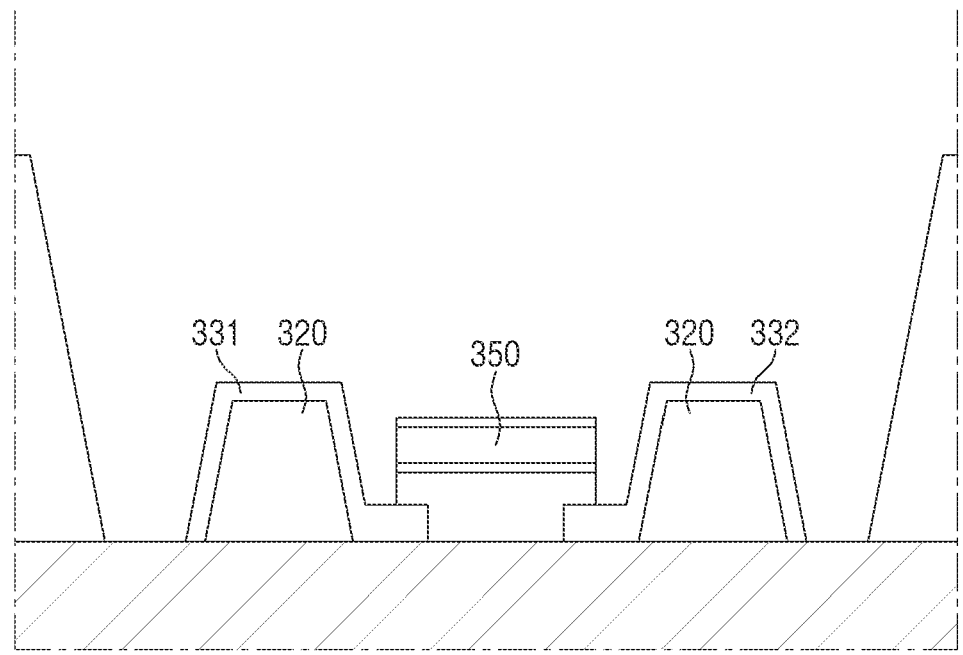

FIGS. 8 to 10 are views showing a method of aligning the light-emitting elements according to an embodiment of the present disclosure.

Referring initially to FIG. 8, a solvent S containing a plurality of light-emitting elements 350 is loaded above the light-emitting unit 300, and the light-emitting elements 350 may be transferred onto the first electrode 331 and the second electrode 332. The solvent S may have a formulation such as ink and paste, and may be one or more of acetone, water, alcohol, and toluene. It is, however, to be understood that the present disclosure is not limited thereto. The solution S is not particularly limited as long as it can be vaporized by room temperature or by heat.

Once the light-emitting elements 350 are transferred onto the light-emitting unit 300, the light-emitting elements 350 are aligned using the dielectrophoresis (DEP) technique.

For example, referring to FIG. 9, a supply voltage from a voltage source V may be applied to the first electrode 331 and the second electrode 332, so that an electric field E is formed between the first electrode 331 and the second electrode 332. The voltage source V may be an external source or a voltage source inside the display device 10. The voltage source V may be either an AC voltage source having predetermined amplitude and period, or a DC voltage source. A voltage source having predetermined amplitude and period can be implemented with the DC voltage source by repeatedly applying to the voltage to the first electrode 331 and the second electrode 332.

When voltage is applied to the first electrode 331 and the second electrode 332, a potential difference is created due to electrical polarities given to the first electrode 331 and the second electrode 332, and thus an electric field E is formed. Under a non-uniform electric field E, bipolarity is induced in the light-emitting elements 350, and the light-emitting elements 350 receives a force toward a larger or smaller slope of the electric field E by the dielectrophoretic force (DEP Force). The light-emitting elements 350 may be self-aligned between the first electrode 331 and the second electrode 332 by the DEP force.

After aligning the light-emitting elements 350, the solvent S is evaporated and removed by room temperature or by heat. As a result, the light-emitting elements 350 may be disposed between the first electrode 331 and the second electrode 332 as shown in FIG. 10. Subsequently, as shown in FIG. 2, the first contact electrode 361, the second contact electrode 362, and a plurality of insulating material layers 370 are formed, to produce the light-emitting unit 300.

The solvent S may include at least one kind of light-emitting elements 350. In order to align the light-emitting elements 350 of different colors in each of the pixel areas PXa of the light-emitting unit 300, the solvent S may contain light-emitting elements 350 that emit lights of a variety of colors. In addition, light-emitting elements 350 that emit light of different colors may be mixed in the solvent S. It is, however, to be understood that the present disclosure is not limited thereto.

Referring back to FIG. 1, the display device 10 may include the color-converting unit 500. The color-converting unit 500 may include a color conversion layer 520 that converts light of a respective wavelength band provided from the light-emitting unit 300 into light of a different wavelength band. Hereinafter, the color-converting unit 500 will be described in detail.

Figure 11:
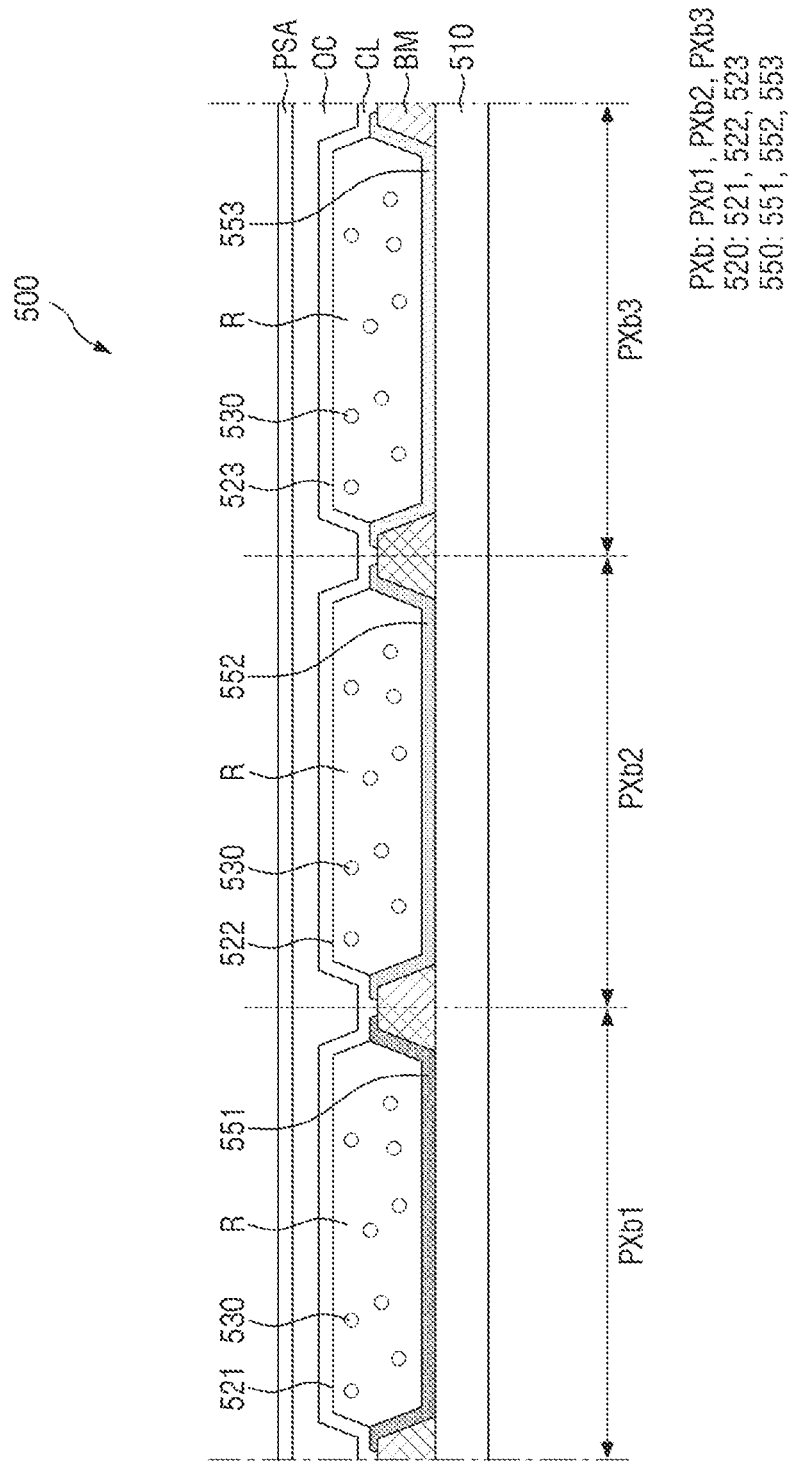
FIG. 11 is a cross-sectional view of a color-converting unit according to an embodiment of the present disclosure.

FIG. 11 is a cross-sectional view of a color-converting unit according to an embodiment of the present disclosure. In the color-converting unit 500 of FIG. 11, a support substrate 510 of the color-converting unit 500 is disposed, and the color conversion layer 520 is disposed on the support substrate 510. That is to say, the display device 10 shown in FIG. 1 is implemented by coupling the color-converting unit 500 of FIG. 11 with the light-emitting unit 300 such that the support substrate 510 faces the upper side.

Referring to FIGS. 1 and 11, the color-converting unit 500 according to an embodiment of the present disclosure may include a support substrate 510, a color conversion layer 520, color filter layers 550, a light-blocking member BM, and a planarization layer OC.

The support substrate 510 may support the color filter layers 550, the color conversion layer 520 and the light-blocking member BM thereon. As shown in FIG. 1, the support substrate 510 may allow light provided from the light-emitting unit 300 thereunder to exit to the outside of the display device 10.

The support substrate 510 may be a transparent insulating substrate. For example, the support substrate 510 may include, but is not limited to, a glass material, a quartz material, or a translucent plastic material.

The light-blocking member BM is disposed on the support substrate 510. The light-blocking member BM may substantially block the transmission of the light provided from the light-emitting unit 300. Therefore, mixing of light emitted from the plurality of pixel layers PXb can be reduced or prevented to improve color gamut and the like. The light-blocking member BM may be disposed in a predetermined pattern. For example, the light-blocking member BM may have a lattice pattern surrounding the plurality of pixel layers PXb.

The light-blocking member BM may include a material having a high absorptivity for visible light. For example, the light-blocking member BM may include, but is not limited to, a metal such as chromium, a metal nitride, a metal oxide, or a resin material colored in black.

The color conversion layer 520 may convert light incident from the light-emitting unit 300 into light of a different color. For example, when blue light L3 is incident from the light-emitting unit 300, the color conversion layer 520 may convert it into green light L2. It is, however, to be understood that the present disclosure is not limited thereto.

The color conversion layer 520 may be disposed between the light-blocking members BM spaced apart from the support substrate 510. It is, however, to be understood that the present disclosure is not limited thereto. A part of the color conversion layer 520 may be disposed on the light-blocking member BM so as to overlap with at least a part of the light-blocking member BM. The color-converting unit 500 may include a plurality of color conversion layers 520. The color conversion layers 520, e.g., a first color conversion layer 521, a second color conversion layer 522 and a third color conversion layer 523, may be disposed on the pixel layers PXb, respectively, to convert and emit the lights incident from the light-emitting unit 300.

The color conversion layers 520 may contain color conversion particles 530 that convert incident first light L of a certain wavelength band into second light L' of a wavelength band different from that of the first light L. According to an embodiment of the present disclosure, the color conversion particles 530 may be quantum-dot materials or phosphor materials.

When the color conversion particles 530 are quantum-dot materials, if the first light L having a certain wavelength band is incident, the valence band (VB) electrons of the quantum-dot materials are excited to the conduction band (CB). Then, the electrons return to the valence band (VB), the second light L' having the converted wavelength band may be emitted.

The quantum-dot materials may have a core-shell structure. The core may be semiconductor nanocrystalline material. Examples of the core of the quantum-dot materials may include, but is not limited to, silicon (Si) nanocrystals, Group II-VI compound nanocrystals, and Group III-V compound nanocrystals, etc. For example, the quantum-dot materials may include a core made of at least one of cadmium selenide (CdSe), cadmium telluride (CdTe), cadmium sulfide (CdS) and indium phosphide (InP), and a shell made of zinc sulfide (ZnS).

When the color conversion particles 530 are quantum-dot materials, the particle size of the quantum-dot materials may be adjusted, to control the wavelength of exiting light. For example, the diameter size of the quantum-dot materials may be approximately 55 Å to 65 Å, and blue light may be incident to emit red light. In addition, the particle size of the quantum-dot materials may be approximately 40 Å to 50 Å, and blue light may be incident to emit green light. It is, however, to be understood that the present disclosure is not limited thereto.

The color conversion particles 530 are not necessarily spherical quantum-dot materials. In some implementations, the color conversion particles 530 may be a phosphor material, a plate-like material, a rod-shaped material, or a perovskite quantum-dot material. The material of the color conversion particles 530 are not particularly limited herein as long as it can convert incident light of a certain wavelength into light of another wavelength. Hereinafter, an example where the color conversion particles 530 are spherical quantum-dot materials will be described.

The color conversion particles 530 may be dispersed on a light transmissive resin R. The light transmissive resin R is not particularly limited as long as it does not absorb light incident on the color conversion layers 520 and does not affect the absorption and emission of the light of the color conversion particles 530. For example, the light transmissive resin R may include, but is not limited to, an organic material such as an epoxy-based resin and an acryl-based resin.

The color conversion layer 520 including the color conversion particles 530 may be formed, for example, via a variety of various processes such as ink jet injection or photo resist (PR).

When light having a wavelength is incident on the color conversion particles 530 and then is emitted after its wavelength has been converted, it has scattering characteristic, i.e., it is emitted in random directions (Lambertian emission). Accordingly, the color conversion layers 520 including such color conversion particles can have uniform luminance of the light emitted from the front and side surfaces, even without additional scatterers. It is to be understood that the color conversion layers 520 may further include additional scatterers (not shown) to increase the light conversion efficiency. The material of the scatterers is not particularly limited as long as they can uniformly scatter light. For example, the scatterers may be nanoparticles such as $SiO_2$, $TiO_2$, $ZrO_2$, $Al_2O_3$, $In_2O_3$, ZnO, $SnO_2$, $Sb_2O_3$, and ITO.

As described above, the color conversion layers 520 containing the color conversion particles 530 may emit light of a certain wavelength band. The color conversion layers 520 may contain various types of color conversion particles 530 depending on the light emitted by the pixel layers PXb. For example, when blue light L3 is incident from the light-emitting unit 300, the first color conversion layer 521 may contain color conversion particles 530 that convert the blue light L3 into red light L1, and the second color conversion layer 522 may contain color conversion particles 530 that convert the blue light into green light L2. Therefore, in order to form a plurality of color conversion layers 520 containing different color conversion particles 530, the same process has to be repeated several times. In contrast, since the display device 10 according to an embodiment of the present disclosure includes only the same kind of color conversion particles 530, for example, only the color conversion particles 530 emitting green light, the number of the process of forming the color conversion layers 520 can be reduced. A detailed description thereon will be given later.

Referring to FIG. 11, the color filter layers 550 may be disposed between the color conversion layer 520 and the support substrate 510. The color filter layers 550 may determine the color of light that is incident from the light-emitting unit 300 and passes through the color conversion layers 520 to be finally displayed on the pixel PX of the display device 10.

The color filter layers 550 may work as a color transmissive layer that transmits incident light as it is. It is, however, to be understood that the present disclosure is not limited thereto. The color filter layers 550 may be a color filter or a wavelength-selective optical filter that transmits first light of a wavelength while blocking or reflecting second light, third light, etc. of other wavelengths.

The color filter layers 550 may include a transparent organic layer and work as a color transmissive layer that transmits incident light as it is. In addition, in order to increase the color purity of the transmitted color, the color filter layers 550 may include a colorant having a color in a respective wavelength band. The colorant may be dispersed in the transparent organic layer of the color filter layers 550. It is, however, to be understood that the present disclosure is not limited thereto.

As shown in FIG. 11, the color filter layers 550 may include a first color filter layer 551, a second color filter layer 552 and a third color filter layer 553. The color filter layers 550 may be disposed in the pixel layers PXb1, PXb2 and PXb3, respectively. Lights of different colors may be incident on the color conversion layers 520 from the pixel areas PXa1, PXa2 and PXa3 of the light-emitting unit 300. Accordingly, the color filter layers 550 may be selectively disposed on the pixel layer PXb1, PXb2 and PXb3 to control the color represented by on the pixels PX1, PX2 and PX3 of the display device 10.

For example, the first color filter layer 551 may be disposed in the first pixel layer PXb1 and may work as a color transmissive layer that transmits incident light as it is. The second color filter layer 552 and the third color filter layer 553 may be disposed in the second pixel layer PXb2 and the third pixel layer PXb3, respectively, so that only light of a respective wavelength band is transmitted and other light is blocked or reflected. It is, however, to be understood that the present disclosure is not limited thereto. The first color filter layer 551, the second color filter layer 552 and the third color filter layer 553 may all work as a color filter. This may be selectively adjusted depending on the configuration of the light-emitting element 350 disposed in the light-emitting unit 300 as will be described later. According to an embodiment of the present disclosure, the display device 10 may include the first color filter layer 551 that is a color light transmissive layer transmitting red light L1, the second color filter layer 552 that is a color filter transmitting green light L2, and the third color filter layer 553 that is a color filter transfer blue light L3. This will be described in detail below.

The color-converting unit 500 may further include a low refractive layer (not shown) disposed to surround the outer surface of the color conversion layer 520. The low-refractive layer may have a lower refractive index than the color conversion layer 520 and the color filter layers 550, and can totally reflect light of a respective wavelength band incident from the color conversion layer 520 or the color filter layer 550. The totally reflected light may be recycled in the color conversion layer 520 to improve light conversion efficiency.

A capping layer CL may be disposed on the outer surface of the color conversion layer 520 to cover and protect the color conversion particles 530 or the light transmissive resin R. FIG. 11 shows an example where the capping layer CL is disposed on the surface opposite to the surface of the color conversion layer 520 that is in contact with the color filter layer 550. It is, however, to be understood that the present disclosure is not limited thereto. The capping layer CL may be disposed on the side surface of the color conversion layer 520 or between the color filter layers 550 and the color conversion layer 520. In addition, in the example shown in FIG. 11, the single capping layer CL is disposed to cover all of the first color conversion layer 521, the second color conversion layer 522, and the third color conversion layer 523. However, a plurality of capping layers CL may be disposed to cover the color conversion layers 521, 522 and 523, respectively.

The capping layer CL may include an inorganic material. For example, the capping layer CL may include, but is not limited to, at least one of silicon oxide (SiOx), silicon nitride (SiNx), and silicon oxynitride (SiOxNy). When the low refractive layer described above is disposed on the outer surface of the color conversion layer 520, the capping layer CL may be eliminated.

The planarization layer OC may be disposed over the color conversion layer 520, the color filter layers 550, the light-blocking member BM, etc. The planarization layer OC may be disposed to cover all elements disposed on the support substrate 510. Accordingly, the planarization layer OC can provide a flat upper surface of the color-converting unit 500 to reduce the level difference created by the elements disposed on the support substrate 510. Since the upper surface of the color-converting unit 500 becomes flat by the planarization layer OC, it can be attached to the light-emitting unit 300 produced via a separate process to fabricate the display device 10, as will be described later.

The planarization layer OC may include an organic material. For example, the planarization layer OC may include a thermosetting resin. For example, the planarization layer OC may include, but is not limited to, at least one selected from the group consisting of a cardo-based resin, a polyimide-based resin, an acrylic-based resin, a siloxane-based resin, and a silsesquioxane-based resin.

When the color-converting unit 500 and the light-emitting unit are produced via different processes, the color-converting unit 500 and the light-emitting unit 300 may be attached together by an adhesive layer PSA. As shown in FIG. 11, an adhesive layer PSA is disposed on the upper surface of the light-emitting unit 300 and on the flat surface of the planarization layer OC of the color-converting unit 500, so that the light-emitting unit 300 can be coupled with the color-converting unit 500.

The type of the adhesive layer PSA is not particularly limited herein as long as it can couple elements with each other. For example, the adhesive layer PSA may be made of an optical clear adhesive (OCA), an optical clear resin (OCR), or a pressure sensitive adhesive (PSA).

Referring back to FIG. 1, the display device 10 may include the first light-emitting element 350_1 emitting red light L1, the second light-emitting element 350_2 emitting blue light L3, and the color conversion particles 530 converting the blue light L3 into green light L2.

For example, the first light-emitting element 350_1 emitting red light L1 may be disposed in the first pixel area PXa1 of the light-emitting unit 300, and the second light-emitting element 350_2 emitting blue light L3 may be disposed in each of the second pixel area PXa2 and the third pixel area PXa3. In addition, the first color conversion layer 521, the second color conversion layer 522 and the third color conversion layer 523 of the color-converting unit 500 may include the color conversion particles 530 that convert the incident blue light L3 into green light L2.

When the display device 10 displays lights of certain wavelength bands, for example, red light L1, green light L2 and blue light L3, different light-emitting elements 350 for emitting lights of different colors may be used. In such case, three light-emitting elements 350 that emit light of red light L1, green light L2 and blue light L3, respectively, are required for fabricating the display device 10. Accordingly, the dielectrophoresis (DEP) technique for disposing the light-emitting elements 350 between the first electrode 331 and the second electrode 332 has to be carried out three times, and an additional process of producing the light-emitting elements 350 is added. The processes of fabricating or disposing the light-emitting elements 350 require a series of steps to be repeatedly performed. As a result, the process cost may be increased, and the yield may be decreased. It is known in the art that light-emitting element 350 emitting green light has a lower luminous efficiency than the light-emitting element 350 emitting blue light due to the nature of the material.

For this reason, previously red light L1, green light L2, and blue light L3 were represented by using one kind of light-emitting element 350 that emits blue light L3, which exhibits excellent luminous efficiency, and by employing the color-converting unit 500. In order to convert the blue light L3 into red light L1 and green light L2, however, processes of forming color conversion layers 520 containing different color conversion particles 530 are required. The processes of forming the color conversion layers 520 also require a series of steps to be repeatedly performed In contrast, according to the embodiment of the present disclosure, the display device 10 includes the first light-emitting element 350_1 emitting red light L1 and the second light-emitting elements 350_2 emitting blue light L3. In addition, the display device 10 includes the color conversion layers 520 including the same kind of color conversion particles 530, for example, color conversion particles 530 allowing green light L2 to exit. In this manner, the number of processes repeatedly performed can be reduced. Moreover, since the green light L2, which has low luminous efficiency due to the nature of the material, is converted into blue light L3, the luminous efficiency of green light L2 can be improved.

As shown in FIG. 1, in the display device 10 according to the embodiment of the present disclosure, the first pixel area PXa1 includes the first light-emitting element 350_1 to emit red light L1, and each of the second pixel area PXa2 and the third pixel area PXa3 includes the second light-emitting element 350_2 to emit blue light L3. The red light L1 emitted from the first pixel area PXa1 is incident on the first color conversion layer 521 and then on the first color filter layer 551. Since the color conversion particles 530 included in the first color conversion layer 521 absorb blue light L3 to convert it into green light L2, the incident red light L1 is not converted but is incident on the first color filter layer 551 as it is. The first color filter layer 551 transmits only red light L1 and blocks the transmission of the lights of the other colors. Accordingly, red light L1 is emitted from the first pixel PX1.

Blue lights L3 are emitted from the second pixel area PXa2 and the third pixel area PXa3 and are incident on the second color conversion layer 522 and the third color conversion layer 523, respectively. The blue lights L3 are incident on the color conversion particles 530 of each of the second color conversion layer 522 and the third color conversion layer 523, and some of them are emitted as green light L2. Accordingly, mixed light of the blue light L3 and the green light L2 is incident on each of the second color filter layer 552 and the third color filter layer 553.

The second color filter layer 552 transmits the green light L2 and blocks the transmission of the lights of the other colors. The third color filter layer 553 transmits the blue light L3 and blocks the transmission of the lights of the other colors. As a result, the green light L2 is emitted from the second pixel PX2, and the blue light L3 is emitted from the third pixel PX3.

As described above, the luminous efficiency of green light L2 is lower than that of blue light L3. In the display device 10 according to the embodiment of the present disclosure, the green light L2 as well as the blue light L3 are incident on the second color filter layer 552 in the second color conversion layer 522 of the second pixel layer PXb2. When the amount of the blue light L3 incident on the second color conversion layer 522 from the second light-emitting element 350_2 is constant, as the amount of the green light L2 converted by the color conversion particles 530 increases, the amount of the green light L2 transmitting the second color filter layer 552 may increase. In an embodiment, the second color conversion layer 522 may include more color conversion particles 530 than the first color conversion layer 521 and the third color conversion layer 523 in the display device 10. In the process of forming the color conversion layers 520, a color conversion particle ink 531 containing a large amount of color conversion particles 530 may be selectively loaded on the second color conversion layer 522. As the number of color conversion particles 530 contained in the second color conversion layer 522 increases, green light L2 converted from the blue light L3 by the color conversion particles 530 may increase. Accordingly, it is possible to suppress a change in the color coordinates of green light L2 that is incident on the second color filter layer 552 in the second color conversion layer 522 and exits to the outside of the display device 10.

Hereinafter, a process of producing the light-emitting unit 300 and the color-converting unit 500 of the display device 10 according to an embodiment will be described. The description will be given with reference to FIGS. 12 to 20.

Figure 12:
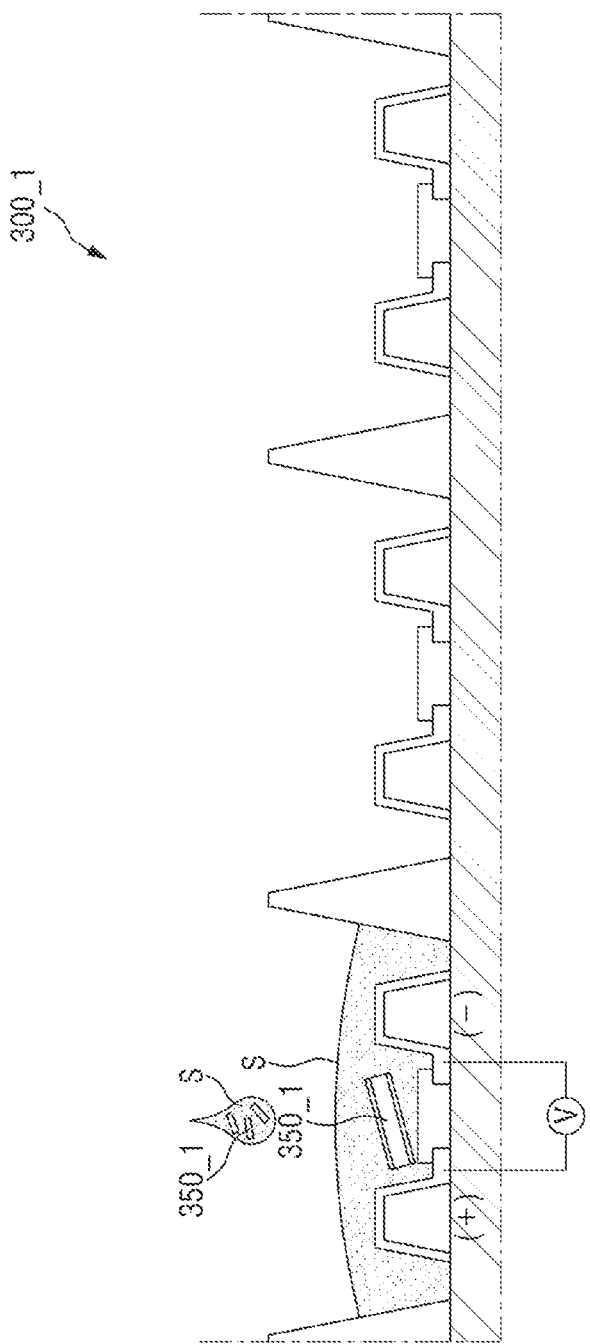
FIGS. 12 to 14 are schematic views showing a process of producing a light-emitting unit including a first color light-emitting element and second color light-emitting elements according to an embodiment of the present disclosure.
Figure 13:
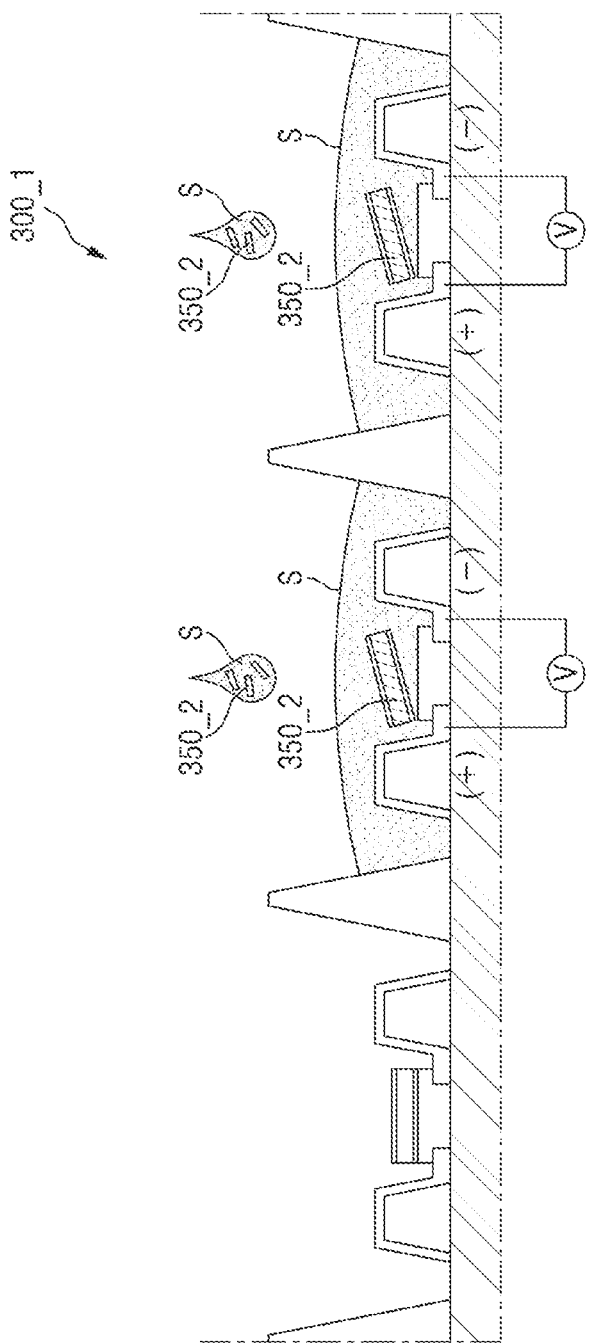
Figure 14:
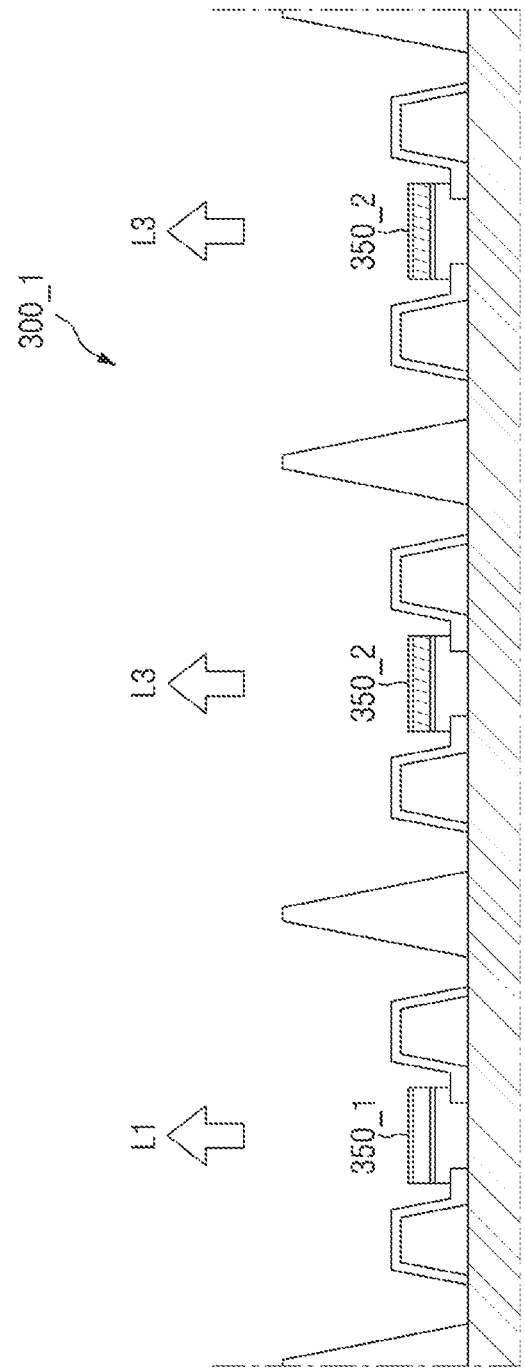

FIGS. 12 to 14 are schematic views showing a process of producing a light-emitting unit including a first color light-emitting element and second color light-emitting elements according to an embodiment of the present disclosure. A light-emitting unit 300_1 includes an area defined by the first pixel area PXa1, the second pixel area PXa2 and the third pixel area PXa3, and adjacent pixel areas may be separated by the first partition walls 380. After loading the light-emitting elements 350, the light-emitting elements 350 may be aligned by the electric field E as described above with reference to FIGS. 8 to 10. Hereinafter, the description will focus the differences.

A light-emitting unit 300_1 may be produced by carrying out a process of aligning the first light-emitting element 350_1 by the dielectrophoresis (DEP) technique once, and a process of aligning the second light-emitting elements 350_2 by the dielectrophoresis (DEP) technique once. As a result, the number of processes of repeatedly performing the dielectrophoresis (DEP) technique can be reduced, as compared to the number of processes of fabricating the light-emitting unit 300 by aligning the light-emitting elements 350 that emit the red light L1, the green light L2, and the blue light L3, respectively.

Initially, referring to FIG. 12, the first light-emitting element 350_1 emitting light of the first color L1 is loaded in the first pixel area PXa1, and the supply voltage is applied between the first electrode 331 and the second electrode 332 to align the first light-emitting element 350_1. The supply voltage is applied only to the first pixel area PXa1 to form an electric field E between the first electrode 331 and the second electrode 332. In doing so, the first partition walls 380 of the light-emitting unit 300 can prevent the first light-emitting element 350_1 from moving to the second pixel area PXa2 or the third pixel area PXa3.

Subsequently, referring to FIG. 13, the second light-emitting element 350_2 emitting blue light is loaded in each of the second pixel area PXa2 and the third pixel area PXa3, and the supply voltage is applied between the first electrode 331 and the second electrode 332 to align the second light-emitting elements 350_2. The supply voltage is applied to the second pixel area PXa2 and the third pixel area PXa3. The first partition walls 380 of the light-emitting unit 300 can prevent the second light-emitting elements 350_2 from moving to the first pixel area PXa1. However, since the same second light-emitting elements 350_2 are disposed in the second pixel area PXa2 and the third pixel area PXa3, the first partition walls 380 may be eliminated between the second pixel area PXa2 and the third pixel area PXa3 in some implementations.

Subsequently, when the solvent S containing the first light-emitting element 350_1 and the second light-emitting element 350_2 is dried or vaporized by heat, the first light-emitting element 350_1 and the second light-emitting elements 350_2 may be disposed between the first electrode 331 and the second electrode 332. Referring to FIG. 14, the first light-emitting element 350_1 is disposed in the first pixel area PXa1, and the second light-emitting element 350_2 is disposed in each of the second pixel area PXa2 and the third pixel area PXa3. Once the first light-emitting element 350_1 and the second light-emitting elements 350_2 are disposed between the first electrode 331 and the second electrode 332, the contact electrodes 361 and 362 and the plurality of insulating material layers 370 are stacked on the first electrode 331 and the second electrode 332, to produce the light-emitting unit 300_1. As will be described later, the light-emitting unit 300_1 is attached to a color-converting unit 500_1 by an adhesive layer PSA, a planarization layer OC may be disposed to provide a flat upper surface of the light-emitting unit 300_1. It is, however, to be understood that the present disclosure is not limited thereto.

Subsequently, a method of producing the color-converting unit 500_1 containing the same color conversion particles 530 will be described. The color-converting unit 500_1 may be produced by sequentially stacking elements such as a light-blocking member BM, a plurality of color filter layers 550, and a color conversion layer 520 on the support substrate 510.

FIGS. 15 to 20 are schematic views showing a method of producing a color-converting unit according to an embodiment of the present disclosure.

Figure 15:
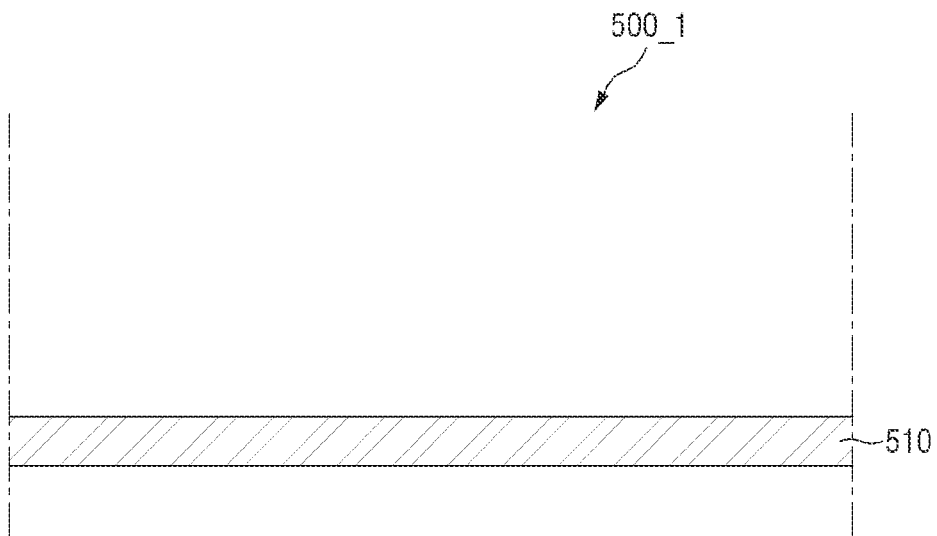
FIGS. 15 to 20 are schematic views showing a method of producing a color-converting unit according to an embodiment of the present disclosure.

Initially, as shown in FIG. 15, the support substrate 510 supporting a plurality of elements included in the color-converting unit 500_1 is prepared. Before forming a variety of elements on the support substrate 510, a cleaning process is carried out to remove foreign substances or dust adhered to the support substrate 510. As described above, the support substrate 510 may include an area defined by the first pixel layer PXb1, the second pixel layer PXb2 and the third pixel layer PXb3, and adjacent pixel layers PXb may be separated by light-blocking members BM, which will be described later.

Figure 16:
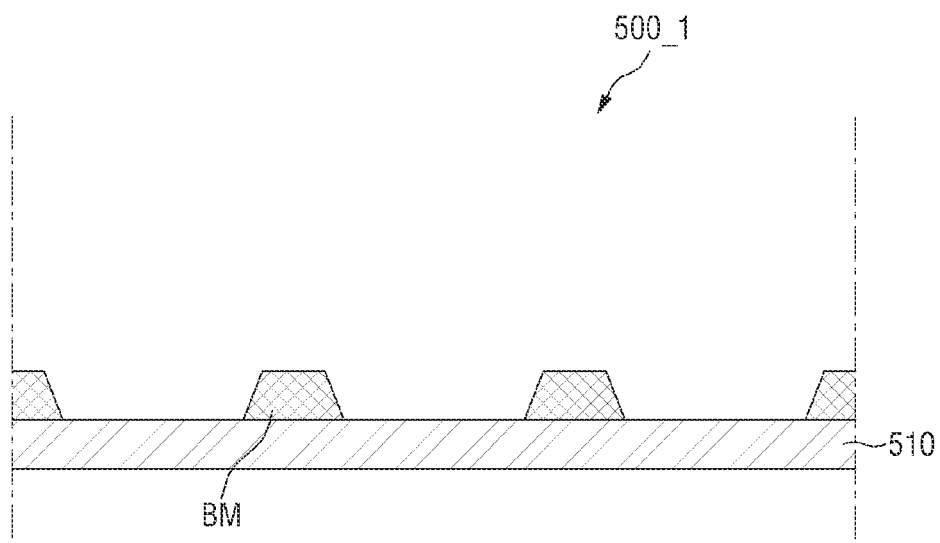

Subsequently, referring to FIG. 16, the light-blocking members BM are formed on the support substrate 510. The configurations of the support substrate 510 and the light-blocking members BM, such as structures and materials have been described above.

Figure 17:
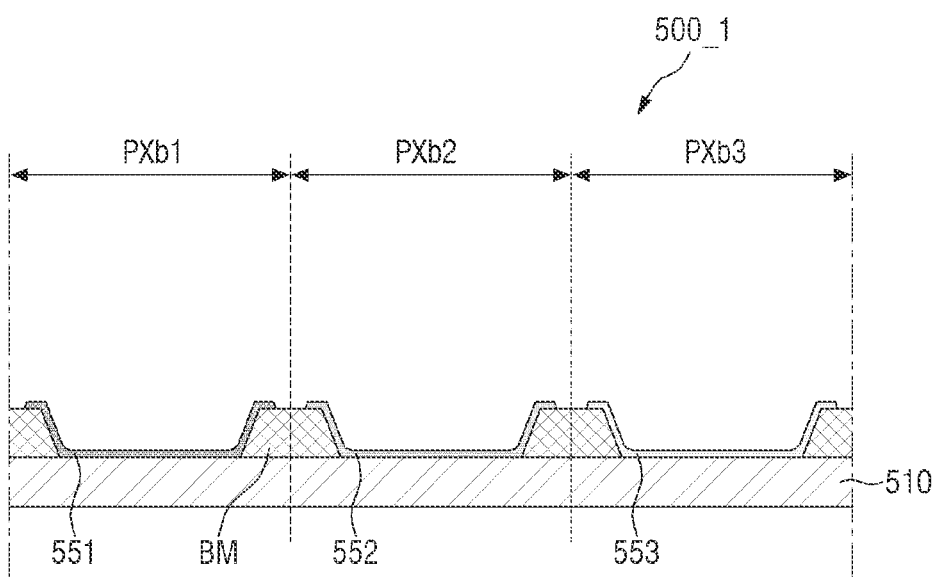

Subsequently, referring to FIG. 17, color filter layers 550 are formed on the support substrate 510 on which the light-blocking members BM are disposed. The color filter layers 550 are disposed on the support substrate 510 and are disposed between the light-blocking members BM spaced apart from one another. For example, the first color filter layer 551, the second color filter layer 552 and the third color filter layer 553 are formed in the first pixel layer PXb1, the second pixel layer PXb2 and the third pixel layer PXb3, respectively. It is, however, to be understood that the present disclosure is not limited thereto.

According to an embodiment of the present disclosure, the first color filter layer 551, the second color filter layer 552 and the third color filter layer 553 disposed on the support substrate 510 may transmit red light L1, green light L2 and blue light L3, respectively, and may block the transmission of lights of the other colors. As described above, each of the first color filter layer 551, the second color filter layer 552 and the third color filter layer 553 may work as either a color transmissive layer or a color filter that transmits only respective light. Accordingly, the pixels PX of the display device 10 can emit lights of different colors as the lights transmit the color filter layers 550 of the support substrate 510.

The color filter layers 550 may be formed by patterning via a photo process using a photosensitive organic material or an inkjet process. It is, however, to be understood that the present disclosure is not limited thereto.

Subsequently, referring to FIGS. 18 and 19, the color conversion particle ink 531 containing the color conversion particles 530 is loaded on each of the color filter layers 550 disposed between the light-blocking members BM, and is dried and cured to form color conversion layers 520. As described above, although the type of the color conversion particles 530 is not particularly limited, such as a quantum-dot material or a rod-type material, it is to be noted that the same color conversion particles 530 are loaded on the color filter layers 550. According to an embodiment of the present disclosure, the color conversion particles 530 may include quantum-dot materials that emit light of green light L2 when blue light L3 is incident. Accordingly, when the red light L1 is incident on the color conversion particles 530, the color conversion particles 530 do not absorb the red light L1, and thus the red light L1 transmits as it is. When the blue light L3 is incident, the color conversion particles 530 absorb the blue light L3 and emit light of the second color L2.

Figure 18:
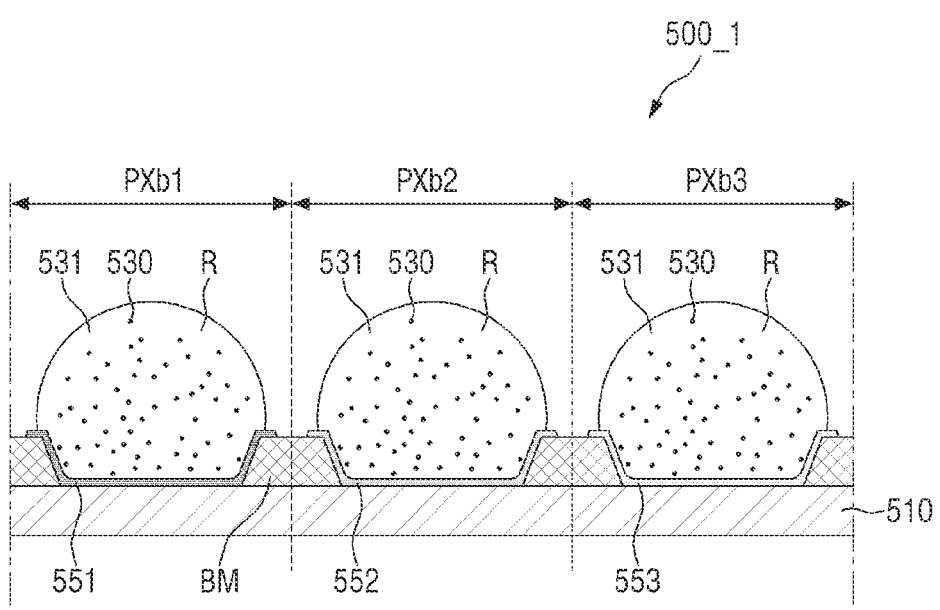
Figure 19:
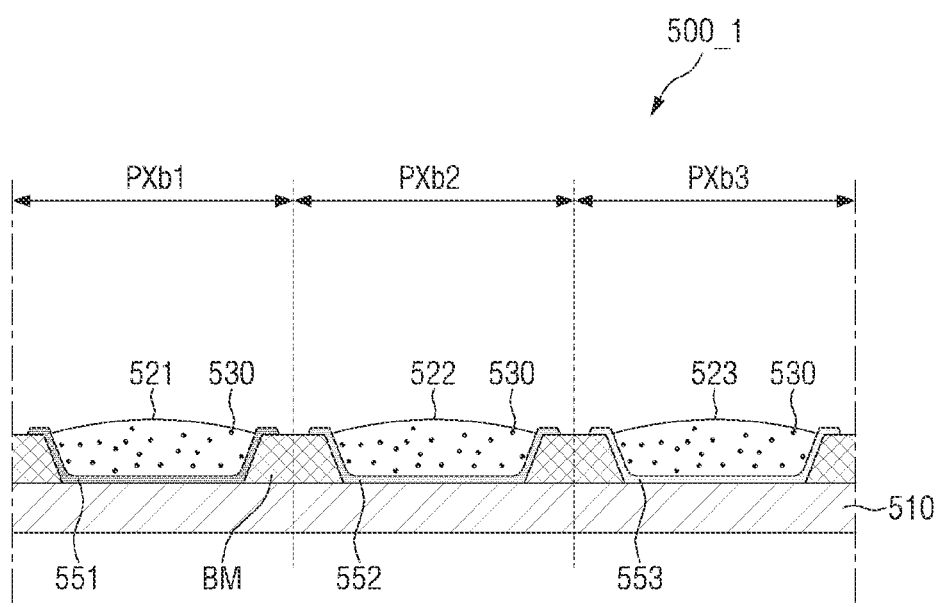

As shown in FIGS. 18 and 19, the color conversion particle ink 531 loaded on the color filter layers 550 cannot move to adjacent pixel layers PXb from around the light-blocking members BM. The light-blocking members BM can prevent the color conversion particle ink 531 from being mixed between the pixel layers PXb. It is to be noted that since the color-converting unit 500 includes the same kind of color conversion particles 530, the color conversion particle ink 531 may be loaded across the pixel layers PXb. That is to say, the color conversion particle ink 531 is not limited to a particular pixel layer PXb but may be loaded on the entire support substrate 510. Accordingly, the process of loading the color conversion particles 530 may be carried out only once during the process of producing the color-converting unit 500_1. Therefore, it is not necessary to perform the inkjet process three times to load different color conversion particles 530 for different pixels, and thus the process cost and yield can be improved. In addition, even if the ink loaded on or each of the pixels overflows to another neighboring pixel PX, there is no chance of color mixing, so that defect rate can be lowered.

Figure 20:
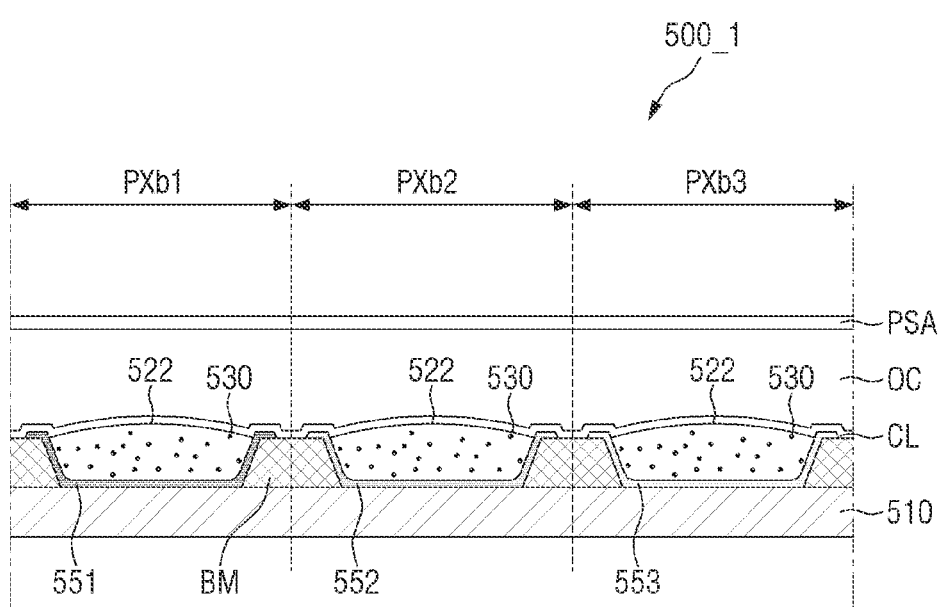

Lastly, as shown in FIG. 20, a planarization layer OC may be formed over the color conversion layers 520 to provide the flat surface of the color-converting unit 500_1. An adhesive layer PSA for bonding with the light-emitting unit 300_1 is formed on the planarization layer OC.

The light-emitting unit 300_1 and the color-converting unit 500_1 thus produced may be attached together by the adhesive layer PSA to fabricate the display device 10 of FIG. 1. The first pixel area PXa1 in which the first light-emitting element 350_1 overlaps with the first pixel layer PXb1 in which the first color filter layer 551 is formed. The red light L1 emitted from the first light-emitting element 350_1 is not converted by the first color conversion layer 521 but can transmit the first color filter layer 551 as it is, so that it can be displayed outside the display device 10.

In addition, the second pixel area PXa2 and the third pixel area PXa3 in which the second light-emitting elements 350_2 are disposed overlap with the second pixel layer PXB2 in which the second color filter layer 552 is formed and the third pixel layer PXb3 in which the third color filter layer 553 is formed, respectively. Some of the blue lights L3 emitted from the second light-emitting elements 350_2 may be converted into green light L2 in the second color conversion layer 522 and the third color conversion layer 523. It is to be noted that the light represented to the outside of the display device 10 are green light L2 and blue light L3 by the second color filter layer 552 and the third color filter layer 553, respectively.

Accordingly, in the display device 10 of FIG. 1 thus fabricated, red light L1 may be emitted from the first pixel PX1, green light L2 may be emitted from the second pixel PX2, and blue light L3 may be emitted from the third pixel PX3. Since the blue light L3 provided from the second light-emitting element 350_2 is converted into green light L2 and displayed as the green light L2, the luminous efficiency of green light can be improved. In addition, compared to existing display devices having the same configuration, the number of processes required for the fabrication can be reduced, thereby reducing the process cost and improving fabrication yield.

In addition, in order to further improve the luminous efficiency of green light L2, the density of the color conversion particles 530 in the second color conversion layer 522 may be higher than the density of the color conversion particles 530 in the first color conversion layer 521 or the third color conversion layer 523.

Not all the blue light L3 incident on the second color conversion layer 522 may be converted into green light L2. The greater the content of the color conversion particles 530, the more blue light L3 can be absorbed and the more green light L2 can exit. For example, when the second color conversion layer 522 includes a larger amount of color conversion particles 530 than the third color conversion layer 523, the amount of the green light L2 incident on the second color filter layer 552 may be larger than the amount of the green light L2 incident on the third color filter 553. Even with the second light-emitting element 350_2 emitting the same blue light L3, it is possible to control the amount of the green light L2 depending on the content of the color conversion particles 530. Accordingly, even if a mixed light of blue light L3 and green light L2 is incident on the second color filter layer 552, it is possible to suppress such that only pure green light L2 exits and such that the color coordinates are changed.

Hereinafter, display devices according to other embodiments of the present disclosure will be described.

Figure 21:
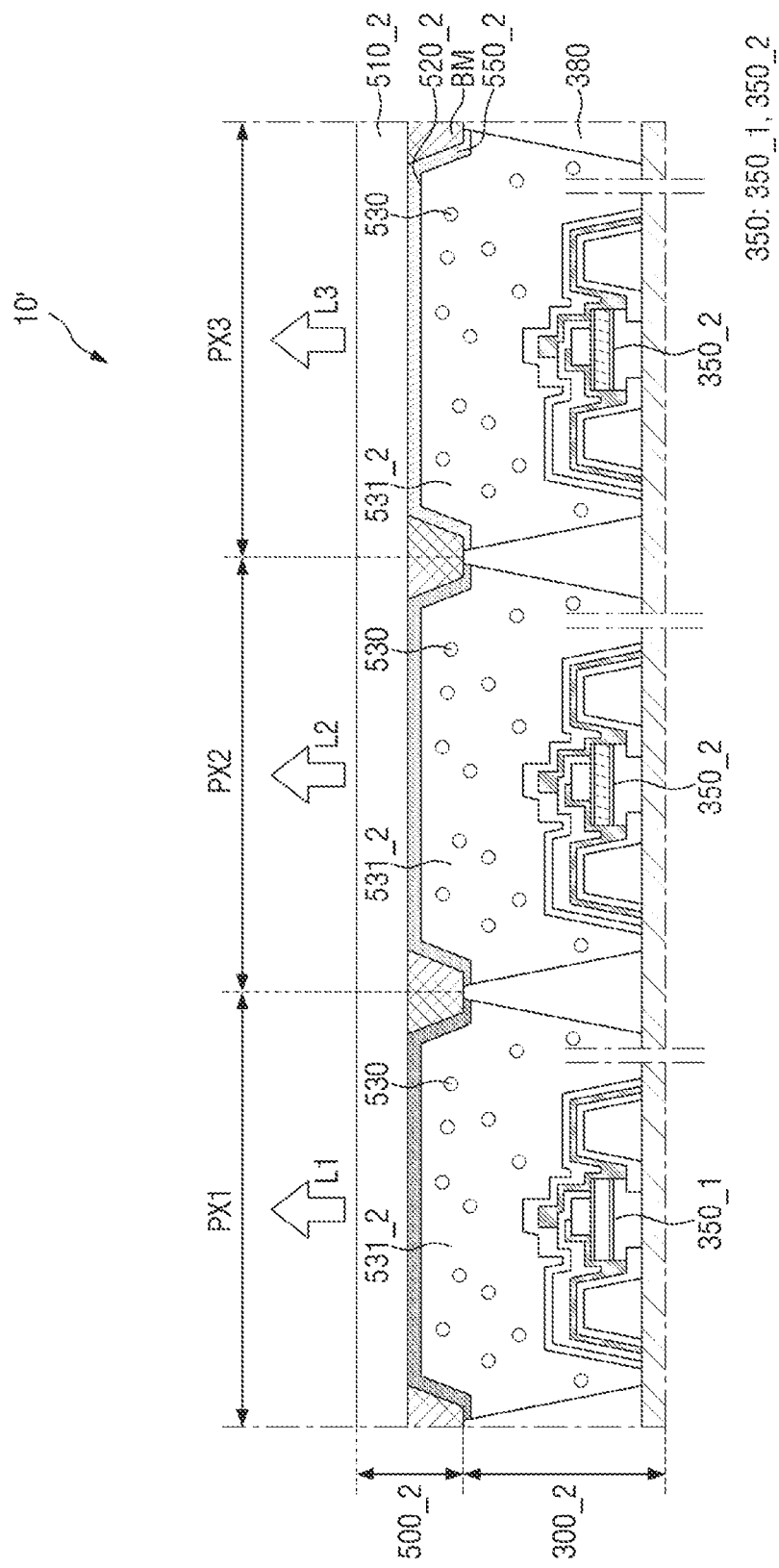
FIG. 21 is a cross-sectional view of a display device according to another embodiment of the present disclosure.
Figure 22:
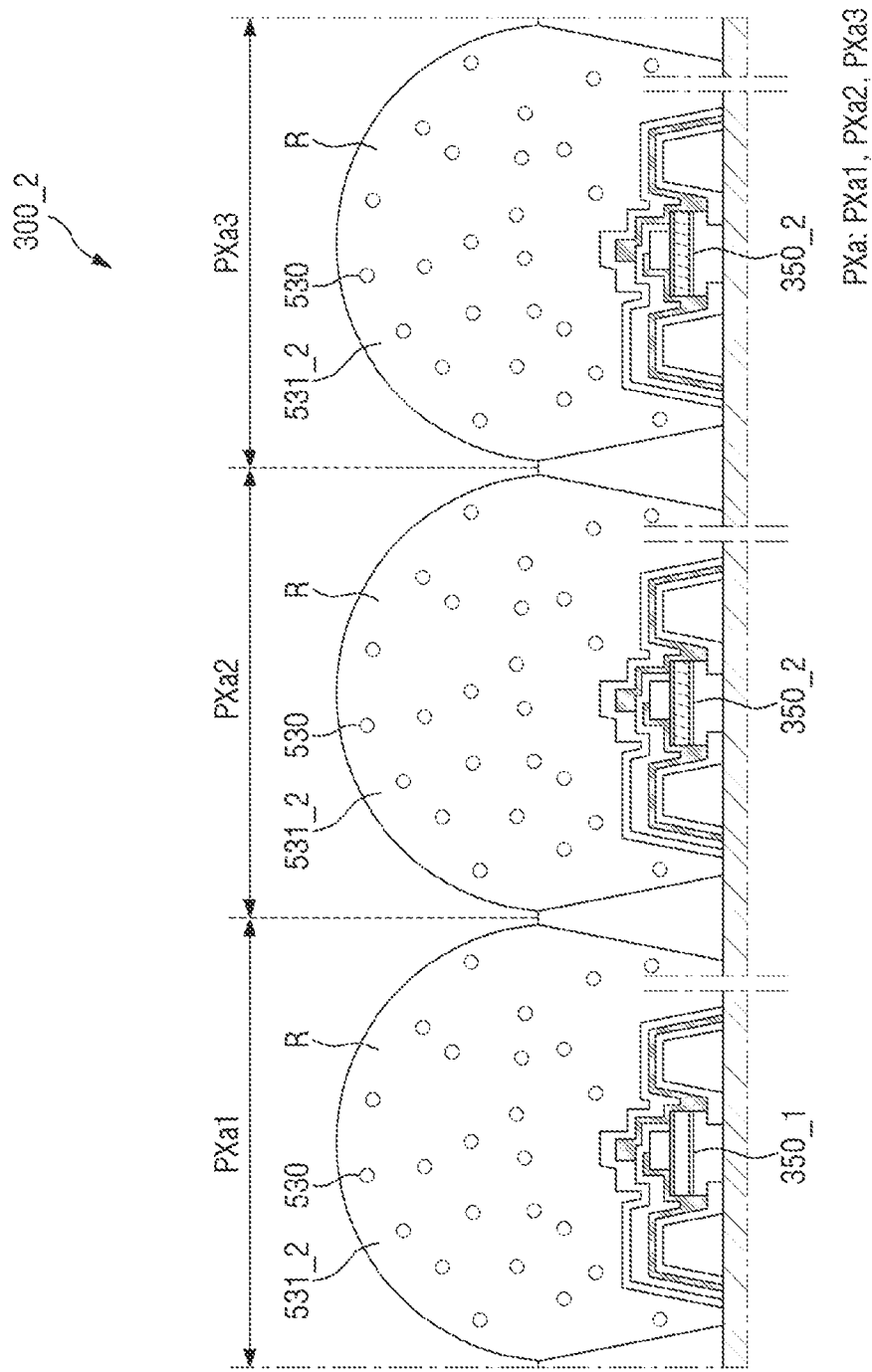
FIG. 22 is a view showing that a color conversion particle ink containing color conversion particles is loaded directly in a light-emitting unit.

FIG. 21 is a cross-sectional view of a display device according to another embodiment of the present disclosure. FIG. 22 is a view showing that a color conversion particle ink containing color conversion particles is loaded directly in a light-emitting unit.

FIG. 21 shows an example of a display device 10' where a color-converting unit 500_2 is formed directly on a light-emitting unit 300_2. For example, according to the embodiment of the present disclosure, the process of producing the light-emitting unit 300_2 and the color-converting unit 500_2 separately and then attaching them together is omitted, unlike the display device 10 of FIG. 1. Accordingly, the adhesive layer PSA and the planarization layer OC of the color-converting unit 500_2 may be eliminated.

In the display device 10' of FIG. 21, a color conversion particle ink 531_2 is loaded directly on the light-emitting unit 300_2 including the first light-emitting element 350_1 and the second light-emitting elements 350_2 to form a color conversion layer 520_2.

For example, as shown in FIG. 22, the color conversion particle ink 531_2 containing the color conversion particles 530 is loaded directly on the first pixel area PXa1, the second pixel area PXa2 and the third pixel area PXa3 of the light-emitting unit 300_2. The first partition walls 380 can prevent the color conversion particle ink 531_2 from moving to another adjacent pixel area PXa, like the light-blocking members BM of the color-converting unit 500_2. However, since the color conversion particles 530 according to an embodiment include the same kind of material, the first partition walls 380 may be eliminated in some implementations. After loading the color conversion particle ink 531_2 containing the color conversion particles 530, the ink is dried or vaporized by heat to form the color conversion layer 520_2. The color filter layer 550_2, the light-blocking member BM and the support substrate 510_2 are stacked on the color conversion layer 520_2, such that the display device 10' can be fabricated. The display device 10' of FIG. 21 is substantially identical to the display device 10 of FIG. 1 except that a color-converting unit 500_2 is formed directly on a light-emitting unit 300_2. Hereinafter, the description will focus on the difference.

Since the color conversion particles 530 are loaded directly on the light-emitting unit 300_2 in the display device 10' of FIG. 21, the color conversion particles 530 may be disposed relatively close to the light-emitting elements 350. In the display device 10 of FIG. 1, at least one planarization layer OC, an adhesive layer PSA, etc. are disposed between the color conversion particles 530 and the light-emitting element 350. In contrast, in the display device 10' of FIG. 21, the color conversion particles 530 may be disposed directly on the light-emitting element 350 and may be disposed on the side surfaces of the light-emitting elements 350 as well.

In addition, since the planarization layer OC may be eliminated in the display device 10', the first partition walls 380 of the light-emitting unit 300_2 may be at least partially in contact with the light-blocking members BM of the color-converting unit 500_2. Accordingly, the first partition walls 380 may support the color-converting unit 500_2 disposed on the light-emitting unit 300_2. In addition, the first partition walls 380 can separate the pixel areas PXa and the pixel layers PXb from one another along with the light-blocking members BM, thereby preventing mixing of colors of the lights emitted from the light-emitting elements 350. It is, however, to be understood that the present disclosure is not limited thereto.

Each of the pixel areas PXa of the light-emitting unit 300_2 may include a plurality of light-emitting elements 350 PXa, and the light-emitting elements 350 may be spaced apart from one another. Although not shown in the drawings, the first electrode 331 and the second electrode 332 may be extended in a direction in the light-emitting unit 300 to be arranged in straight lines. That is to say, a region formed as the first electrode 331 is spaced apart from the second electrode 332 may also be a straight line. Accordingly, a plurality of light-emitting elements 350 disposed between the first electrode 331 and the second electrode 332 may have some empty spaces formed between the light-emitting elements 350, and the color conversion particles 530 may be disposed directly in the empty spaces. In such case, most of the lights emitted from the light-emitting elements 350 may enter the color conversion particles 530 even without any additional low refractive layer. Accordingly, light leakage can be reduced to further improve light conversion efficiency.

In addition, in the display device 10' according to this embodiment, the first light-emitting element 350_1 and the second light-emitting element 350_2 may be disposed together in each of the pixel areas PXa of the light-emitting unit 300.

Figure 23:
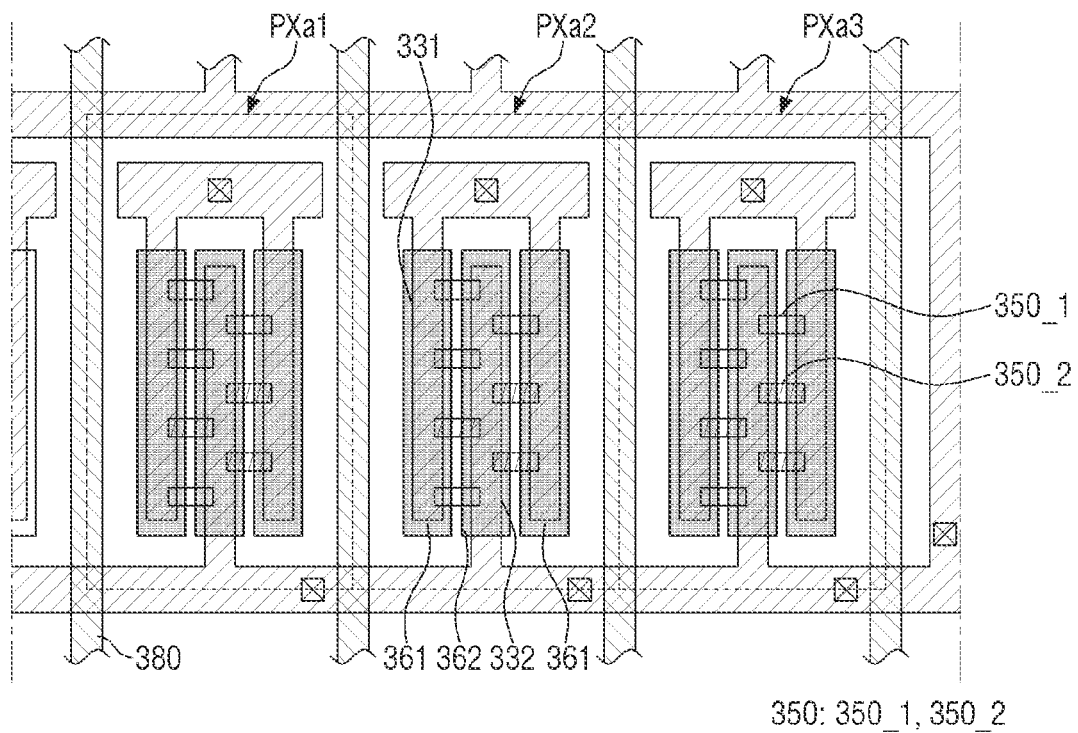
FIG. 23 is a plan view showing a light-emitting unit of a display device according to yet another embodiment of the present disclosure.

FIG. 23 is a plan view showing a light-emitting unit of a display device according to yet another embodiment of the present disclosure. FIG. 24 is a view showing a process of aligning light-emitting elements in a light-emitting unit of the display device of FIG. 23.

Referring to FIGS. 23 and 24, different light-emitting elements 350 may be disposed together in a single pixel area PXa. For example, as shown in FIG. 23, a first light-emitting element 350_1 emitting red light L1 and a second light-emitting element 350_2 emitting blue light L3 may be disposed together in each of the pixel areas PXa. That is to say, in each of the pixel areas PXa, mixed light of red light L1 and blue light L3 may be incident on the respective color conversion layers 520. During the process of aligning the light-emitting elements 350_1 and 350_2 between the first electrode 331 and the second electrode 332 that are spaced apart from each other, an ink 531_2 with which the first light-emitting elements 350_1 and the second light-emitting elements 350_2 are mixed may be loaded at a time, and voltage may be applied to all the pixel areas PXa, thereby aligning the first light-emitting elements 350_1 and the second light-emitting elements 350_2 together.

In the display device 10 according to an embodiment of the present disclosure, as the first light-emitting elements 350_1 and the second light-emitting elements 350_2 are disposed together in each of the pixel areas PXa, red light L1 as well as blue light L3 may be incident on the color conversion layers 520. That is to say, the first color conversion layer 521, the second color conversion layer 522 and the third color conversion layer 523 may allow the green light L2 converted by the color conversion particles 530 to exit as well as the red light L1 and the blue light L3 incident from the light-emitting unit 300. In such case, the first color filter layer 551, the second color filter layer 552 and the third color filter layer 553 all work as color filters, so that red light L1, green light L2 and blue light L3 may exit to the outside of the display device 10.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

The invention claimed is:

1. A display device comprising:
   a first pixel, a second pixel, and a third pixel;
   a light-emitting layer comprising a first light-emitting element disposed in the first pixel, a second light-emitting element disposed in the second pixel, and a third light-emitting element disposed in the third pixel;
   color conversion layers disposed on the light-emitting layer, and comprising a first color conversion layer disposed in the first pixel, a second color conversion layer disposed in the second pixel, and a third color conversion layer disposed in the third pixel; and
   color filter layers disposed on the color conversion layers, and comprising a first color filter layer disposed in the first pixel, a second color filter layer disposed in the second pixel, a third color filter layer disposed in the third pixel,
   wherein the first light-emitting element and the second light-emitting element emit first light, a central wavelength range of the first light being a first wavelength,
   wherein the first color conversion layer and the second color conversion layer contain color conversion particles that convert the first light into second light,
   wherein a central wavelength range of the second light is a second wavelength that is longer than the first wavelength,
   wherein the third light-emitting element emits third light, a central wavelength range of the third light being a third wavelength that is longer than the second wavelength,
   wherein the third color conversion layer contains the color conversion particles,
   wherein the first color filter layer transmits the first light and blocks transmission of the second light,
   wherein the second color filter layer transmits the second light and blocks transmission of the first light, and
   wherein the third color filter layer blocks transmission of the first light and the second light and transmits the third light.

2. The display device of claim 1, wherein the third color filter layer receives the third light.

3. The display device of claim 2, wherein the color conversion particles do not convert a wavelength of the third light.

4. The display device of claim 1, wherein each of the first color filter layer and the second color filter layer receives a mixed light of the first light and the second light.

5. The display device of claim 1, wherein the color conversion particles are dispersed in the first color conversion layer, the second color conversion layer and the third color conversion layer, and
   wherein a density of the color conversion particles dispersed in the second color conversion layer is greater than a density of the color conversion particles of each of the first color conversion layer and the third color conversion layer.

6. The display device of claim 5, wherein an amount of the second light incident on the second color filter layer is greater than an amount of the second light incident on the first color filter layer.

7. The display device of claim 6, wherein the central wavelength range of the first light ranges from 430 nm to 470 nm,
   wherein the central wavelength range of the second light ranges from 530 nm to 570 nm, and
   wherein the color conversion particles comprise quantum-dot materials.

8. The display device of claim 1, wherein at least a part of the first color conversion layer overlaps with the first light-emitting element,
   wherein at least a part of the second color conversion layer overlaps with the second light-emitting element,
   wherein at least a part of the third color conversion layer overlaps with the third light-emitting element, and
   wherein the color conversion particles are disposed adjacent to at least one of the first light-emitting element, the second light-emitting element and the third light-emitting element.

9. The display device of claim 8, wherein the color conversion particles are disposed to overlap with side surfaces of at least one side of the first light-emitting element, the second light-emitting element, and the third light-emitting element.

10. The display device of claim 1, wherein the light-emitting layer further comprises a first partition wall disposed between the first light-emitting element and the second light-emitting element, and a second partition wall disposed between the second light-emitting element and the third light-emitting element.

11. The display device of claim 10, wherein at least a part of the first light emitted from the second light-emitting element and transmitted toward the first color conversion layer or the third color conversion layer is reflected off the first partition wall and the second partition wall to be incident on the second color conversion layer.

12. The display device of claim 1, further comprising:
   a first planarization layer disposed on the light-emitting layer to cover the first light-emitting element, the second light-emitting element and the third light-emitting element;
   a second planarization layer disposed under the color conversion layers to provide a flat lower surface of the color conversion-layers; and
   an adhesive layer disposed between the first and second planarization layers,
   wherein the first planarization layer, the adhesive layer and the second planarization layer are stacked on one another between the light-emitting layer and the color conversion layers.

13. A display device comprising:
   a first pixel, a second pixel and a third pixel;
   a light-emitting layer;
   color conversion layers disposed on the light-emitting layer; and
   color filter layers disposed on the color conversion layers,
   wherein the light-emitting layer comprises a first light-emitting element disposed in the first pixel, a second light-emitting element disposed in the second pixel, and a third light-emitting element disposed in the third pixel, wherein the color conversion layers comprise a first color conversion layer disposed in the first pixel, a second color conversion layer disposed in the second pixel, and a third color conversion layer disposed on the third pixel, wherein the color filter layers comprise a first color filter layer disposed in the first pixel, a second color filter layer disposed in the second pixel, and a third color filter layer disposed in the third pixel, wherein the first light-emitting element, the second light-emitting element and the third light-emitting element emit mixed light of a first light having a first wavelength and a third light having a third wavelength, the third wavelength being longer than the first wavelength, wherein the first color conversion layer, the second color conversion layer and the third color conversion layer contain color conversion particles that convert the first light into second light having a second wavelength, the second wavelength being longer than the first wavelength and shorter than the third wavelength, wherein the first color filter layer transmits the first light and blocks transmission of the second light and the third light, wherein the second color filter layer transmits the second light and blocks transmission of the first light and the third light, and wherein the third color filter layer transmits the third light and blocks transmission of the first light and the second light.

14. The display device of claim 13, wherein a mixed light of the first light and the second light is incident on each of the first color conversion layer, the second color conversion layer, and the third color conversion layer.

15. The display device of claim 14, wherein a mixed light of the first light, the second light and the third light is incident on each of the first color filter layer, the second color filter layer, and the third color filter layer.

16. The display device of claim 15, wherein the color conversion particles are dispersed in the first color conversion layer, the second color conversion layer and the third color conversion layer, and wherein a density of the color conversion particles dispersed in the second color conversion layer is greater than a density of the color conversion particles of each of the first color conversion layer and the third color conversion layer.

17. The display device of claim 16, wherein an amount of the second light incident on the second color filter layer is greater than an amount of the second light incident on the first color filter layer.

18. The display device of claim 13, wherein at least a part of the first color conversion layer overlaps with the first light-emitting element, wherein at least a part of the second color conversion layer overlaps with the second light-emitting element, wherein at least a part of the third color conversion layer overlaps with the third light-emitting element, and wherein the color conversion particles are disposed adjacent to at least one of the first light-emitting element, the second light-emitting element and the third light-emitting element.

19. The display device of claim 13, further comprising:
a first planarization layer disposed on the light-emitting layer to cover the first light-emitting element, the second light-emitting element and the third light-emitting element;
a second planarization layer disposed under the color conversion layers to provide a flat lower surface of the color conversion layers; and
an adhesive layer disposed between the first and second planarization layers,
wherein the first planarization layer, the adhesive layer and the second planarization layer are stacked on one another between the light-emitting layer and the color conversion layers.

\* \* \* \* \*